United States Patent
Ling et al.

(10) Patent No.: US 12,550,331 B2
(45) Date of Patent: Feb. 10, 2026

(54) THREE-DIMENSIONAL MEMORY DEVICE AND METHOD

(71) Applicant: Taiwan Semiconductor Manufacturing Co., Ltd., Hsinchu (TW)

(72) Inventors: Chia-Yu Ling, Hsinchu (TW); Katherine H. Chiang, New Taipei (TW); Chung-Te Lin, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 11 days.

(21) Appl. No.: 18/366,740

(22) Filed: Aug. 8, 2023

(65) Prior Publication Data

US 2023/0389326 A1 Nov. 30, 2023

Related U.S. Application Data

(62) Division of application No. 17/316,243, filed on May 10, 2021, now Pat. No. 11,856,782.

(60) Provisional application No. 63/156,442, filed on Mar. 4, 2021.

(51) Int. Cl.
*H10B 51/20* (2023.01)
*G11C 11/22* (2006.01)
*H10B 51/10* (2023.01)
*H10B 51/30* (2023.01)

(52) U.S. Cl.
CPC ............ *H10B 51/20* (2023.02); *G11C 11/223* (2013.01); *H10B 51/10* (2023.02); *H10B 51/30* (2023.02)

(58) Field of Classification Search
CPC ........ H10B 51/10; H10B 51/20; H10B 51/30; H01L 29/40111; H01L 29/516; H01L 29/517; H01L 29/518; G11C 11/223
See application file for complete search history.

(56) References Cited

U.S. PATENT DOCUMENTS

| | | | |
|---|---|---|---|
| 9,698,156 B2 * | 7/2017 | Lue | H10B 43/10 |
| 2020/0026990 A1 * | 1/2020 | Lue | G06N 3/063 |
| 2020/0051990 A1 * | 2/2020 | Harari | G11C 16/0483 |
| 2020/0295031 A1 * | 9/2020 | Lue | H10B 43/27 |
| 2021/0159241 A1 | 5/2021 | Li et al. | |

(Continued)

FOREIGN PATENT DOCUMENTS

| | | |
|---|---|---|
| CN | 105453267 A | 3/2016 |
| CN | 111386607 A | 7/2020 |

*Primary Examiner* — Matthew E Warren
(74) *Attorney, Agent, or Firm* — Slater Matsil, LLP

(57) ABSTRACT

3D memory array devices and methods of manufacturing are described herein. A method includes etching a first trench and a second trench in a multilayer stack, the multilayer stack including alternating dielectric layers and sacrificial layers. The method further includes forming a word line by replacing a sacrificial layer with a conductive material. Once the word line has been formed, a first transistor is formed in the first trench, the first transistor including a first channel isolation structure. A cut channel plug is formed in the second trench, a centerline of the cut channel plug being aligned with a centerline of the channel isolation structure. The method further includes forming a second transistor in the second trench adjacent the cut channel plug, the word line being electrically coupled to the first transistor and the second transistor.

20 Claims, 22 Drawing Sheets

(56) References Cited

U.S. PATENT DOCUMENTS

2021/0175253 A1\* 6/2021 Han .................. H10D 30/6757
2021/0296360 A1\* 9/2021 Hsu ..................... H10B 63/845
2021/0375934 A1\* 12/2021 Lu ..................... H10D 30/0415

\* cited by examiner

100

100

100

100

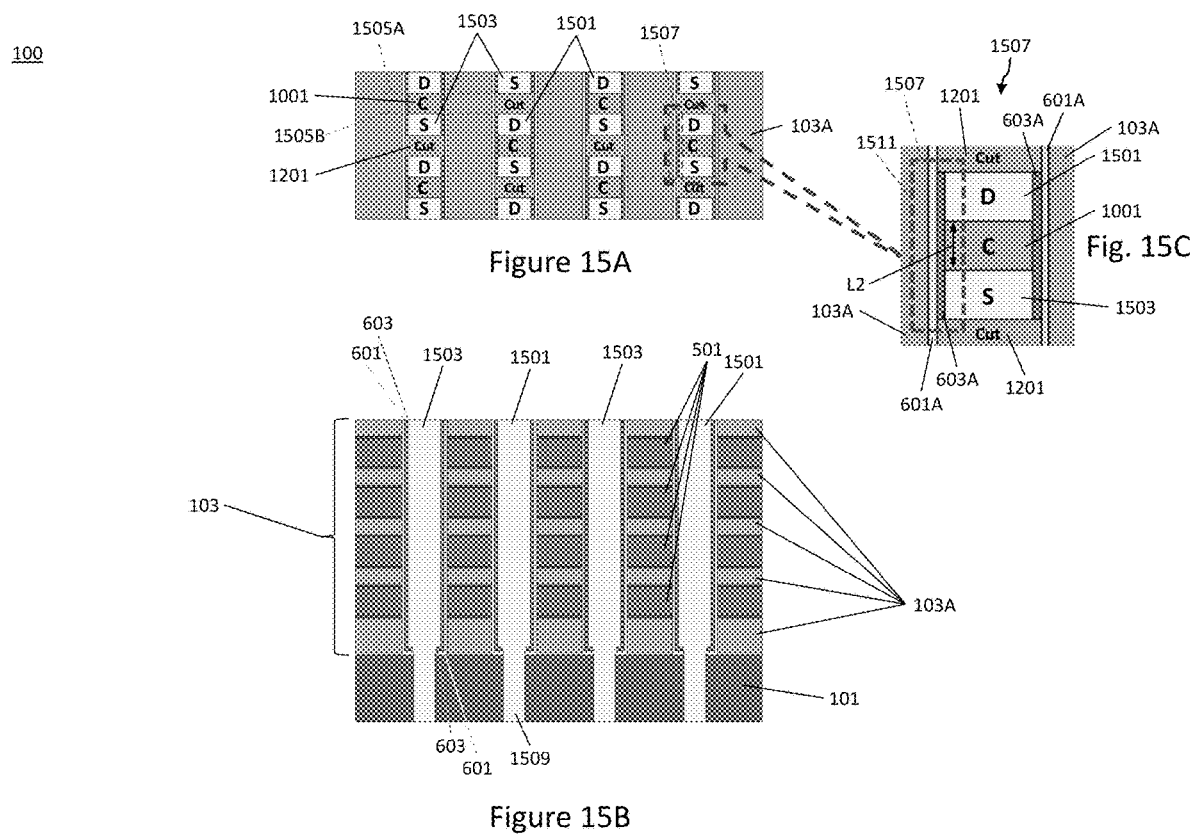

100

THREE-DIMENSIONAL MEMORY DEVICE AND METHOD

PRIORITY CLAIM AND CROSS-REFERENCE

This application is a divisional of U.S. patent application Ser. No. 17/316,243, filed on May 10, 2021, now U.S. Pat. No. 11,856,782, issued Dec. 26, 2023, which claims the benefit of U.S. Provisional Application No. 63/156,442, filed on Mar. 4, 2021, each application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 15D are various views of intermediate stages in the manufacturing of a memory array, in accordance with some embodiments.

DETAILED DESCRIPTION

Figure 1A:
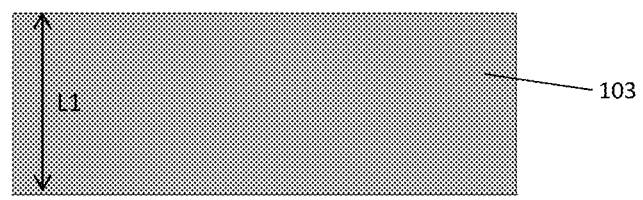

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 17:
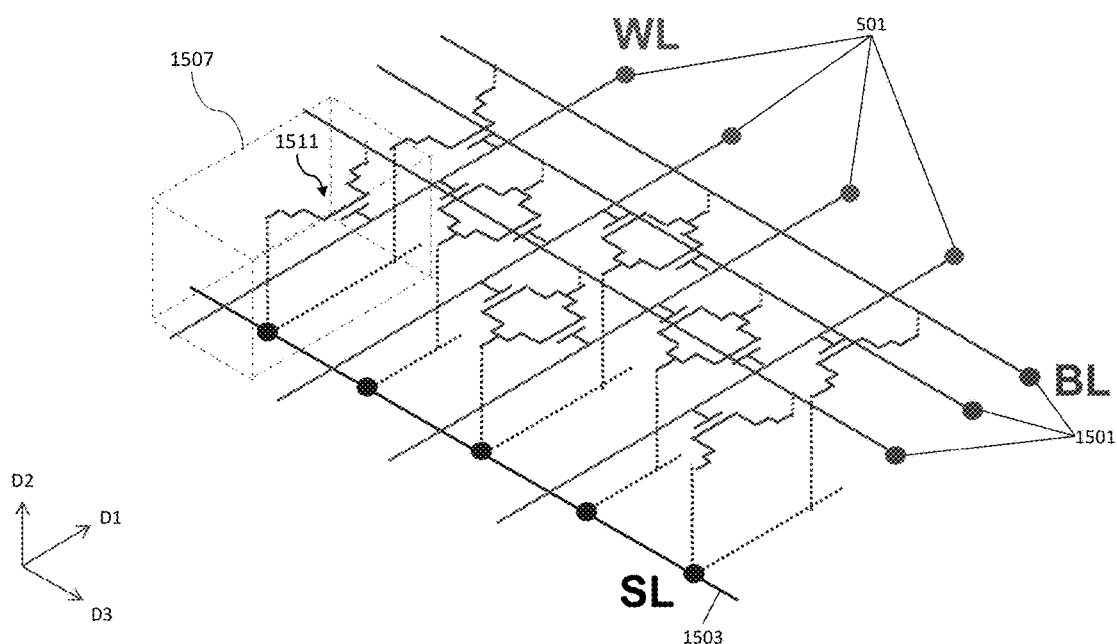
FIG. 17 is a circuit diagram of the memory array, according to some embodiments.
Figure 18:
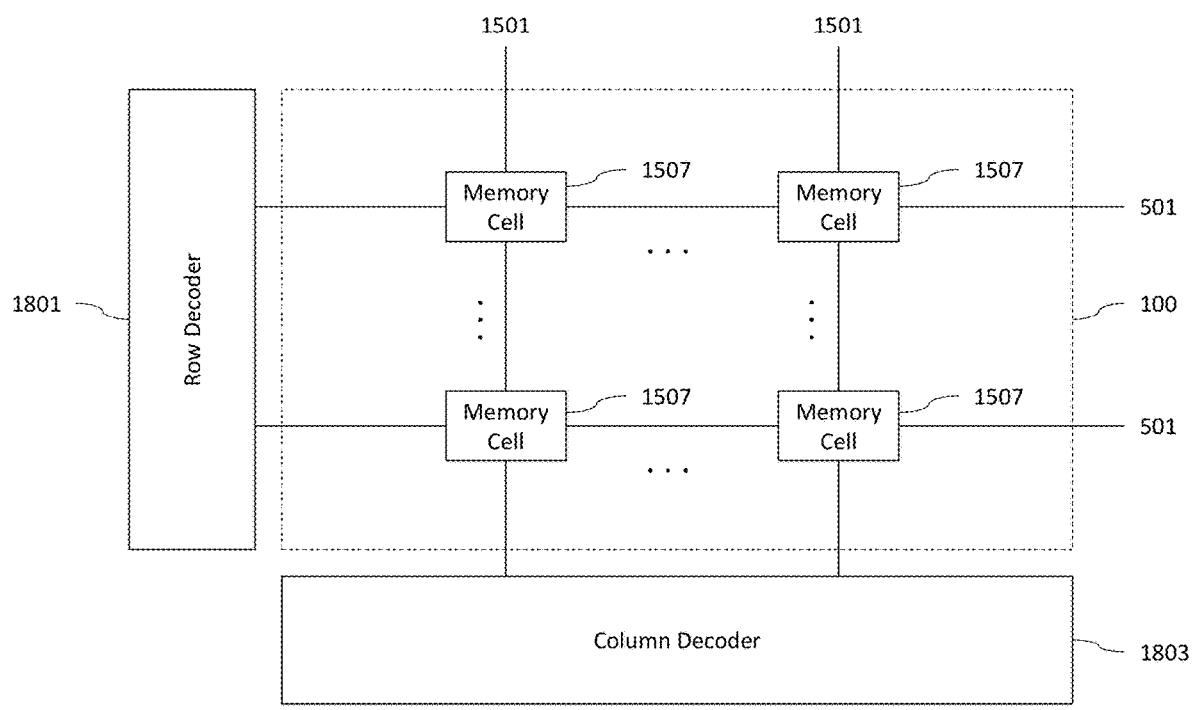
FIG. 18 is a block diagram of a random-access memory, in accordance with some embodiments.
Figures 19A, 19B, 19C:
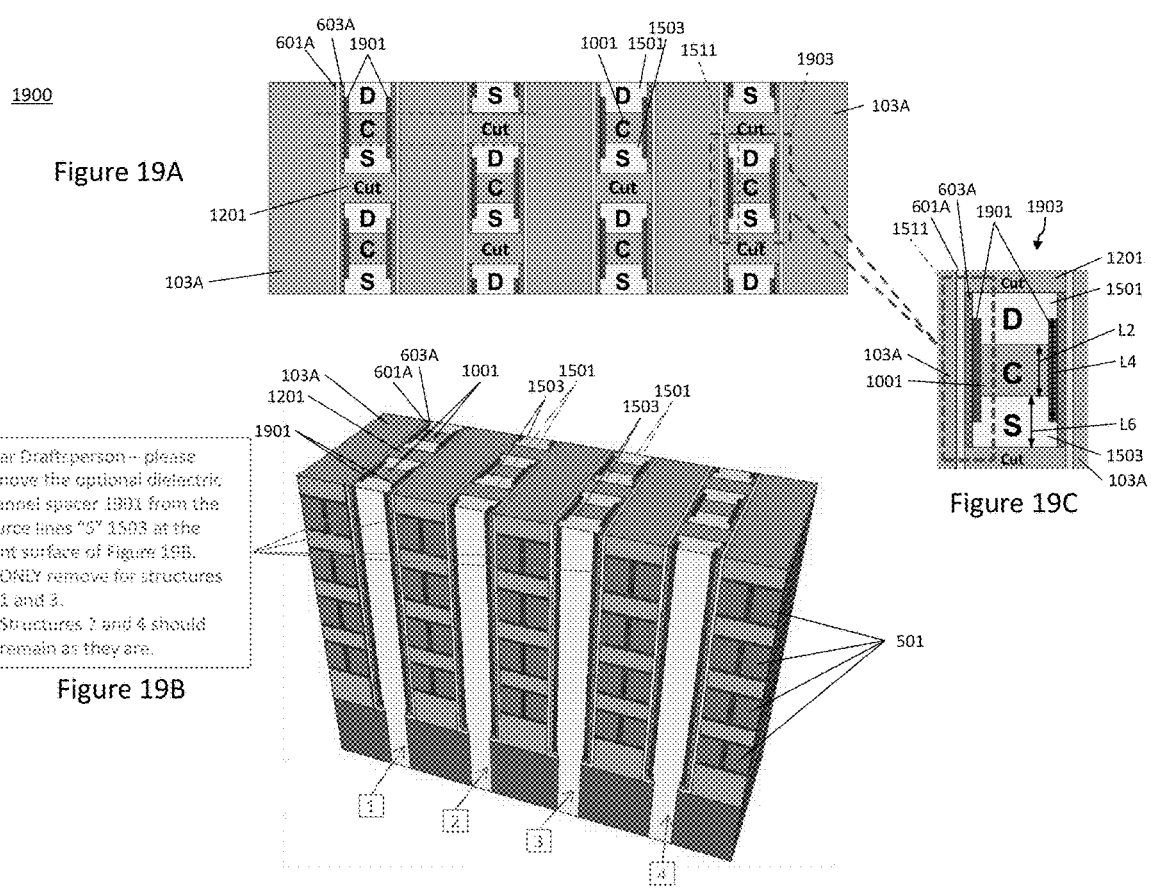
FIGS. 19A-19C illustrate various views of a memory array, according to some other embodiments.

FIGS. 1A through 20B are various views of intermediate stages in the manufacturing of various memory arrays, in accordance with some embodiments. A portion of the various memory arrays are illustrated. Some features, such as a staircase arrangement of the word lines, are not shown in every figure for clarity of illustration. FIGS. 1A, 2A, 3A, 4A, 5A, 6A, 7A, 8A, 9A, 10A, 11A, 12A, 13A, 14A, 15A, 16B, 19A, and 20A are top down views of the various memory arrays. FIGS. 1B, 2B, 3B, 4B, 5B, 6B, 7B, 8B, 9B, 10B, 11B, 12B, 13B, 14B, 15B, and 16A are cross-sectional views of the various memory arrays. FIGS. 10C, 11C, 13C, 15C, 16C, 19C, and 20B are magnified views of an area highlighted in the top down views. FIGS. 15D and 19B are three-dimensional views of various memory arrays, according to some embodiments. FIG. 17 is a circuit diagram of the first memory array 100, in accordance with some embodiments. FIG. 18 is a block diagram of the memory array, in accordance with some embodiments.

Figure 1B:
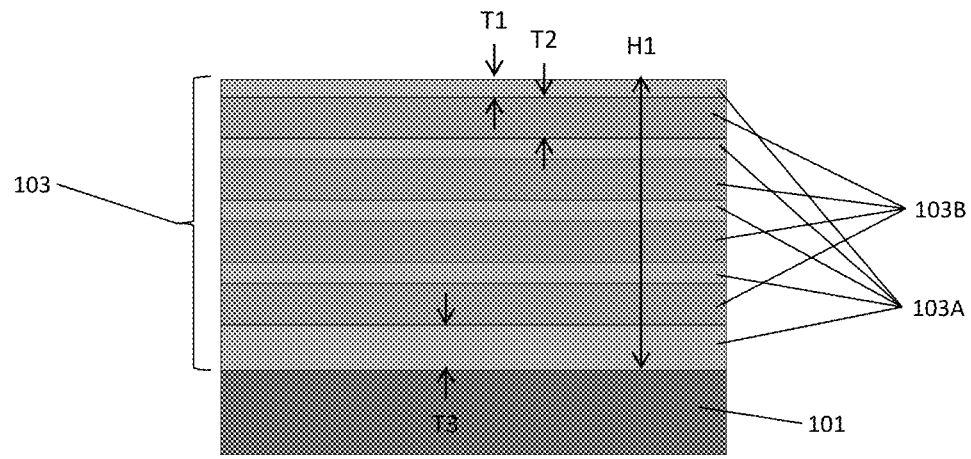

In FIGS. 1A and 1B, a substrate 101 is provided in a formation of a first memory array 100. The substrate 101 may be a semiconductor substrate, such as a bulk semiconductor, a semiconductor-on-insulator (SOI) substrate, or the like, which may be doped (e.g., with a p-type or an n-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multilayered or gradient substrate may also be used. In some embodiments, the semiconductor material of the substrate 101 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. The substrate 101 may include a dielectric material. For example, the substrate 101 may be a dielectric substrate, or may include a dielectric layer on a semiconductor substrate. Acceptable dielectric materials for dielectric substrates include oxides such as silicon oxide; nitrides such as silicon nitride; carbides such as silicon carbide; the like; or combinations thereof such as silicon oxynitride, silicon oxycarbide, silicon carbonitride, or the like. In some embodiments, the substrate 101 is formed of silicon carbide.

A multilayer stack 103 is formed over the substrate 101. The multilayer stack 103 includes alternating first dielectric layers 103A and second dielectric layers 103B. The first dielectric layers 103A are formed of a first dielectric material, and the second dielectric layers 103B are formed of a second dielectric material. The dielectric materials may each be selected from the candidate dielectric materials of the substrate 101. In the illustrated embodiment, the multilayer stack 103 includes five layers of the first dielectric layers 103A and four layers of the second dielectric layers 103B. It should be appreciated that the multilayer stack 103 may include any number of the first dielectric layers 103A and the second dielectric layers 103B.

The multilayer stack 103 will be patterned in subsequent processing. As such, the dielectric materials of the first dielectric layers 103A and the second dielectric layers 103B both have a high etching selectivity from the etching of the substrate 101. The patterned material of the first dielectric layers 103A will be used to isolate subsequently formed thin film transistors (TFTs). The patterned material of the second dielectric layers 103B are sacrificial layers (or dummy layers), which will be removed in subsequent processing and replaced with word lines for the TFTs. As such, the second dielectric material of the second dielectric layers 103B also has a high etching selectivity from the etching of the first dielectric material of the first dielectric layers 103A. In embodiments where the substrate 101 is formed of silicon carbide, the first dielectric layers 103A can be formed of an oxide such as silicon oxide, and the second dielectric layers 103B can be formed of a nitride such as silicon nitride. Other combinations of dielectric materials having acceptable etching selectivity from one another may also be used.

Each layer of the multilayer stack 103 may be formed by an acceptable deposition process such as chemical vapor deposition (CVD), atomic layer deposition (ALD), or the like. A thickness of each of the layers may be in the range of about 15 nm to about 90 nm. In some embodiments, the first dielectric layers 103A are formed to a different thickness than the second dielectric layers 103B. For example, the first dielectric layers 103A can be formed to a first thickness T1 and the second dielectric layers 103B can be formed to a second thickness T2, with the second thickness T2 being from about 0% to about 100% [greater/less] greater than the first thickness T1. In some embodiments, a bottommost layer of the 103A may have a third thickness T3 being from about 0% to about 100% [greater/less] greater than the first thickness T1. The multilayer stack 103 can have a first height H1 in the range of about 1000 nm to about 10000 nm (such as about 2000 nm) and can have a first length L1 in the range of about 100 µm and about 200 µm (such as greater than about 100 µm).

Additionally, while the embodiment discussed above illustrates the first memory array 100 being formed directly over the substrate 101 (e.g., a semiconductor substrate) in a front end of line process, this is intended to be illustrative and is not intended to be limiting upon the embodiments. Rather, the first memory array 100 may be formed in either a front end of line process or a back end of line process, and may be formed either as an embedded memory array or as a stand-alone structure. Any suitable formation of the first memory array 100 may be utilized, and all such formations are fully intended to be included within the scope of the embodiments.

FIGS. 2A through 15D illustrate a process in which trenches are patterned in the multilayer stack 103 and TFTs are formed in the trenches, as will be discussed in greater detail below. In some embodiments, a single-patterning process is used to form the TFTs. However, a double-patterning process may also be used. For example, a multiple-patterning process may be a double patterning process, a quadruple patterning process, or the like. FIGS. 2A through 15D illustrate a single-patterning process. In a single-patterning process, first trenches 201 (see FIGS. 2A and 2B) are patterned in the multilayer stack 103 with a first etching process, and components for the TFTs are formed in the first trenches 201.

Figure 2A:
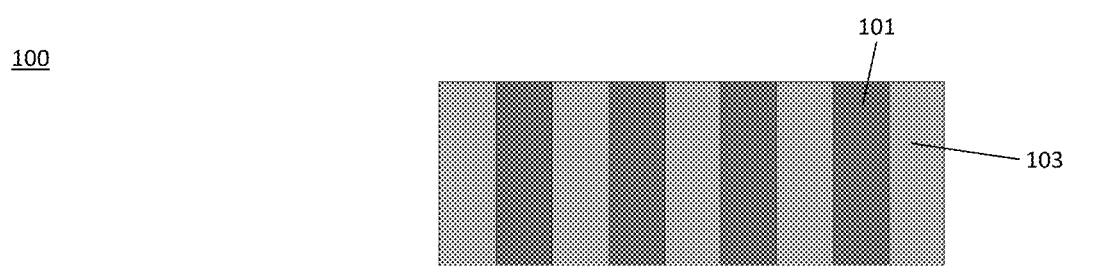
Figure 2B:
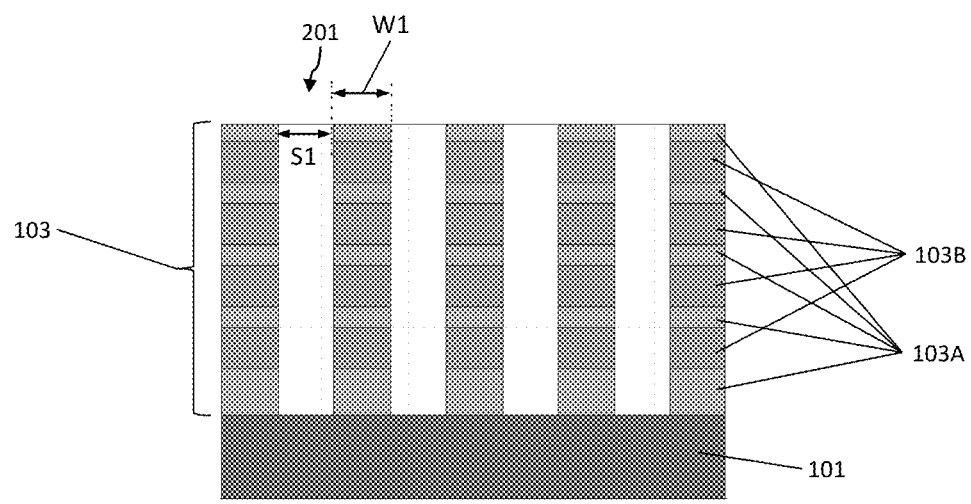

In particular, FIGS. 2A and 2B illustrate first trenches 201 formed in the multilayer stack 103. In the illustrated embodiment, the first trenches 201 extend through the multilayer stack 103 and expose the substrate 101. In another embodiment, the first trenches 201 extend through some but not all layers of the multilayer stack 103. The first trenches 201 may be formed using acceptable photolithography and etching techniques, such as with an etching process that is selective to the multilayer stack 103 (e.g., etches the dielectric materials of the first dielectric layers 103A and the second dielectric layers 103B at a faster rate than the material of the substrate 101). The etching may be any acceptable etch process, such as a reactive ion etch (RIE), neutral beam etch (NBE), the like, or a combination thereof. The etching may be anisotropic. In embodiments where the substrate 101 is formed of silicon carbide, the first dielectric layers 103A are formed of silicon oxide, and the second dielectric layers 103B are formed of silicon nitride, the first trenches 201 can be formed by a dry etch using a fluorine-based gas (e.g., $C_4F_6$) mixed with hydrogen ($H_2$) or oxygen ($O_2$) gas.

A portion of the multilayer stack 103 is disposed between each pair of the first trenches 201. Each portion of the multilayer stack 103 can have a width W1 in the range of about 50 nm to about 500 nm (such as about 240 nm), and has the height H1 discussed with respect to FIGS. 1A and 1B. Further, each portion of the multilayer stack 103 is separated by a separation distance S1, which can be in the range of about nm and about 200 nm (such as about 80 nm). The aspect ratio (AR) of each portion of the multilayer stack 103 is the ratio of the height H1 to the width of the narrowest feature of the portion of the multilayer stack 103, which is the width W1 at this step of processing. In accordance with some embodiments, when the first trenches 201 are formed, the aspect ratio of each portion of the multilayer stack 103 is in the range of about 5 to about 15. Forming each portion of the multilayer stack 103 with an aspect ratio of greater than about 5 allows the first memory array 100 to have sufficient memory cell density. Forming each portion of the multilayer stack 103 with an aspect ratio of less than about 15 helps to prevent twisting or collapsing of the multilayer stack 103 in subsequent processing.

Figure 3A:
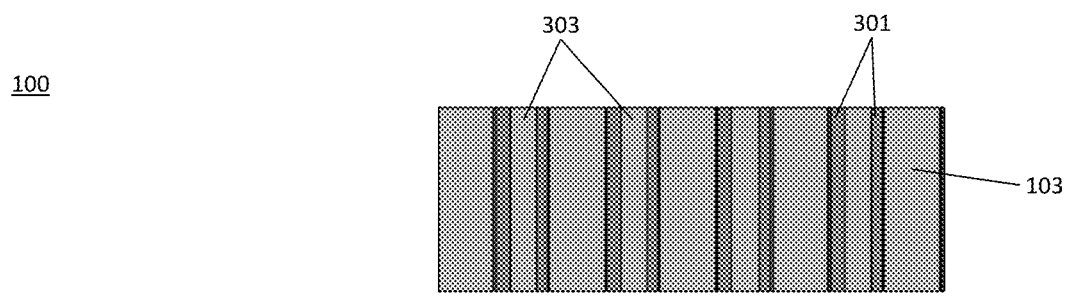
Figure 3B:
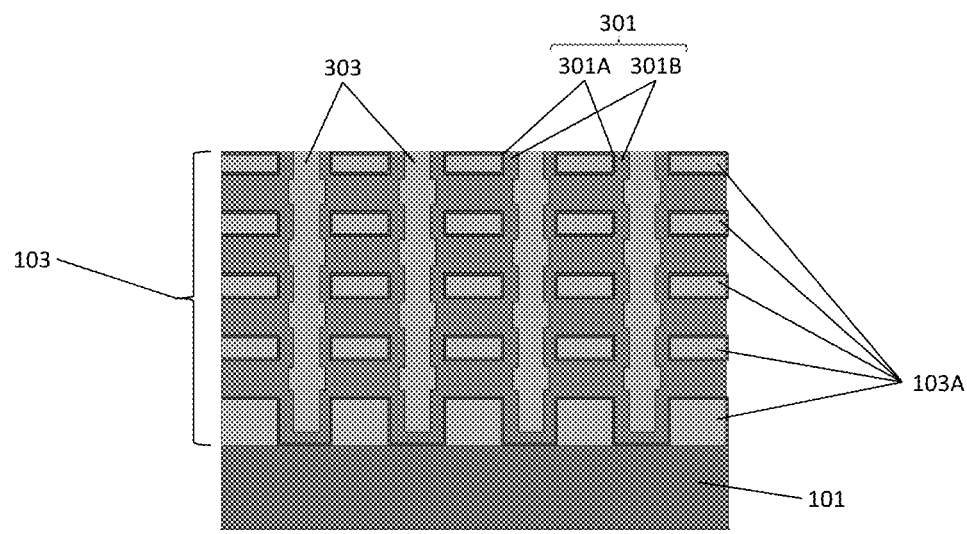

FIGS. 3A and 3B illustrate a formation of first conductive features 301 and dielectric spacers 303 within the first trenches 201, according to some embodiments. The first conductive features 301 may be formed by initially expanding the first trenches 201. Specifically, portions of the sidewalls of the second dielectric layers 103B exposed by the first trenches 201 are removed or recessed. The removal may be formed by an acceptable etching process, such as one that is selective to the material of the second dielectric layers 103B (e.g., selectively etches the material of the second dielectric layers 103B at a faster rate than the materials of the first dielectric layers 103A and the substrate 101) while relying on structures not separately illustrated in these views to support remaining portions of the multilayer stack 103. The etching may be isotropic. In embodiments where the substrate 101 is formed of silicon carbide, the first dielectric layers 103A are formed of silicon oxide, and the second dielectric layers 103B are formed of silicon nitride, the removal may be performed by a wet etch using phosphoric acid ($H_3PO_4$). However, any suitable etching process, such as a dry selective etch, may also be utilized.

Once removed, first conductive features 301 are formed to fill and/or overfill the first trenches 201. The first conductive features 301 may each comprise one or more layers, such as seed layers, glue layers, barrier layers, diffusion layers, and fill layers, and the like. In some embodiments, the first conductive features 301 each include a seed layer 301A (or glue layer) and a main layer 301B, although in other embodiments the seed layer 301A may be omitted. The seed layers 301A are formed of a first conductive material that can be utilized to help grow or to help adhere the subsequently deposited material, and may be titanium nitride, tantalum nitride, titanium, tantalum, molybdenum, ruthenium, rhodium, hafnium, iridium, niobium, rhenium, tungsten, combinations of these, oxides of these, or the like. The main layer 301B may be formed of a second conductive material, such as a metal, such as tungsten, cobalt, aluminum, nickel, copper, silver, gold, molybdenum, ruthenium, molybdenum nitride, alloys thereof, or the like. The material of the seed layer 301A is one that has good adhesion to the material of the first dielectric layers 103A, and the material of the main layer 301B is one that has good adhesion to the material of the seed layer 301A. In embodiments where the first dielectric layers 103A are formed of an oxide such as silicon oxide, the seed layer 301A can be formed of titanium nitride and the main layer 301B can be formed of tungsten. The seed layer 301A and main layer 301B may each be formed by an acceptable deposition process such as chemical vapor deposition (CVD), atomic layer deposition (ALD), or the like to partially or completely fill the first trenches 201.

In embodiments in which the main layer 301B does not fully fill the first trenches 201, once the main layer 301B has been deposited in the first trenches 201, the dielectric spacers 303 are formed of a dielectric material and are deposited to fill and/or overfill the remaining space within the first trenches 201. Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, or the like. The material of the dielectric spacers 303 may be formed by an acceptable deposition process such as ALD, CVD, flowable CVD (FCVD), or the like. The material of the dielectric spacers 303 also has a high etching selectivity from the etching of the first dielectric material of the first dielectric layers 103A. In embodiments where the first dielectric layers 103A are formed of an oxide such as silicon oxide, the material of the dielectric spacers 303 can be formed of a nitride such as silicon nitride. Other combinations of dielectric materials having acceptable etching selectivity from one another may also be used.

Once the dielectric spacers 303 have been deposited in order to fill and/or overfill the first trenches 201, the dielectric spacers 303 and the first conductive features 301 may be planarized to remove excess material outside of the first trenches 201. In an embodiment, the dielectric spacers 303 and the first conductive features 301 may be planarized using, e.g., a chemical mechanical planarization (CMP) process. However, any suitable planarization process, such as a grinding process, may also be utilized. The dielectric spacers 303 provide a robust structure and help to prevent the first conductive features 301 from bending during planarization. The dielectric spacers 303 may also be referred to herein as isolation layers or dummy layers.

Figure 4A:
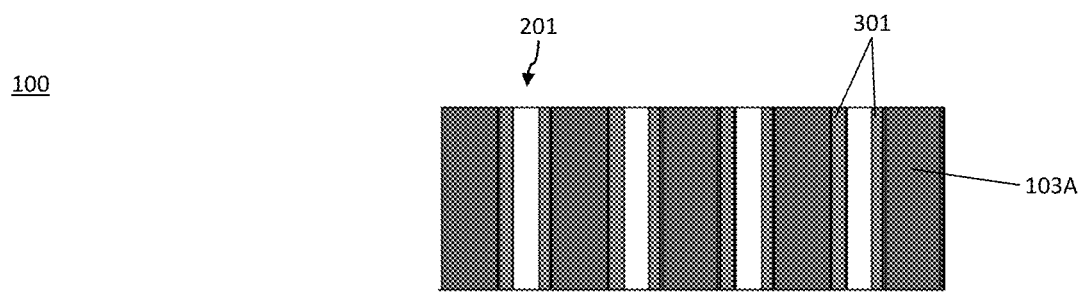
Figure 4B:
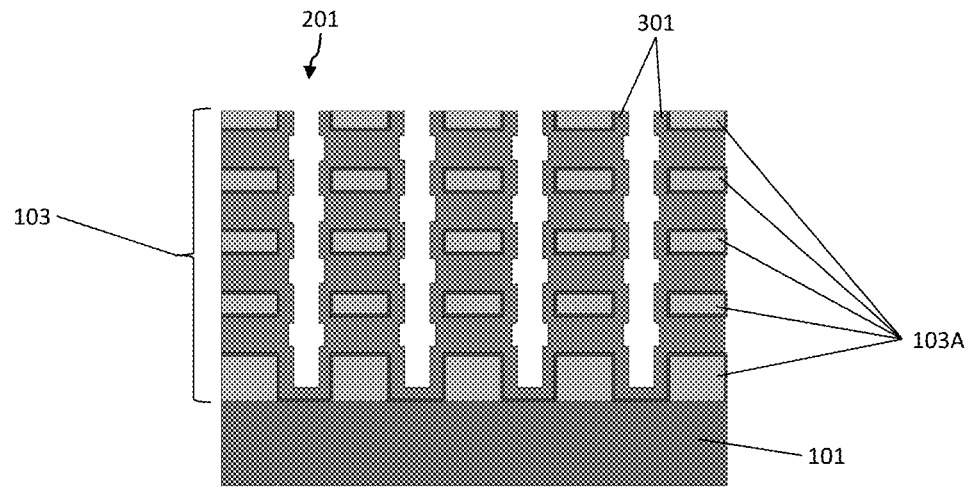

FIGS. 4A-4B illustrate a removal of the dielectric spacers 303 from the first trenches 201. In an embodiment in which the dielectric spacers 303 are formed as a nitride material such as silicon nitride and the first dielectric layers 103A are formed as an oxide such as silicon oxide, the dielectric spacers 303 can be removed by a wet etch using phosphoric acid ($H_3PO_4$). However, any suitable etching process, such as a dry selective etch, may also be utilized to remove the material of the dielectric spacers 303.

Additionally, while a single-patterning process is illustrated above to form the first conductive features 301, multiple-patterning processes may also be utilized and all such patterning processes are within the scope of the embodiments. For example, a double-patterning process may be used, and in such embodiments, once the first trenches 201 are patterned in the multilayer stack 103 with the first etching process, components for a first subset of the first conductive features 301 are formed in the first trenches 201. Second trenches are then patterned in the multilayer stack 103 between the first subset of the first conductive features 301 using a second etching process, and a second subset of the first conductive features 301 are formed in the second trenches. Forming the first conductive features 301 with a multiple-patterning process allows each patterning process to be performed with a low pattern density, which can help reduce defects while still allowing the first memory array 100 to have sufficient memory cell density, while also helping to prevent the aspect ratio from becoming too high and causing problems with structural instability.

Figure 5A:
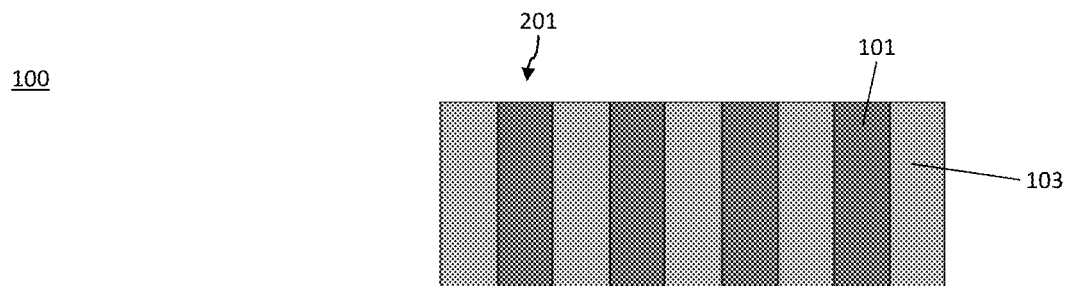
Figure 5B:
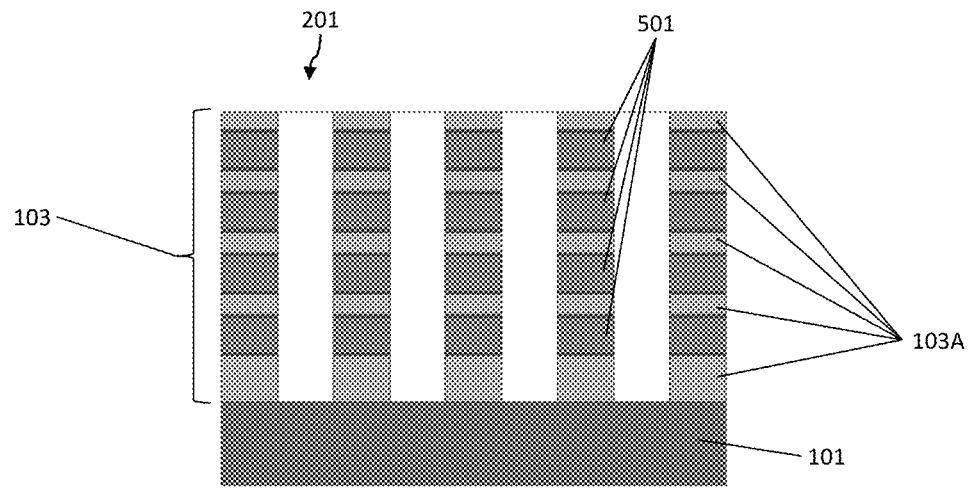

FIGS. 5A-5B illustrate an etch back process in a formation of word lines 501 by removing excess portions of the first conductive features 301 and to expose the first dielectric layers 103A. In an embodiment the etch back process may be performed using, e.g., an anisotropic etching process. However, any suitable etching process may be utilized.

In an embodiment, the etch back process is performed until the material of the first conductive features 301 that is not covered by the first dielectric layers 103A have been removed. As such, the remaining material of the first conductive features 301 has a similar width as the remaining portion of the first dielectric layers 103A (e.g., 80 nm). However, any suitable dimension may be utilized.

Figure 6A:
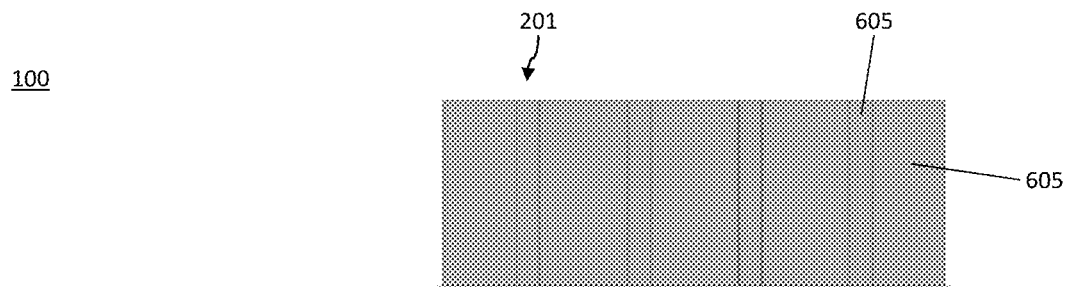
Figure 6B:
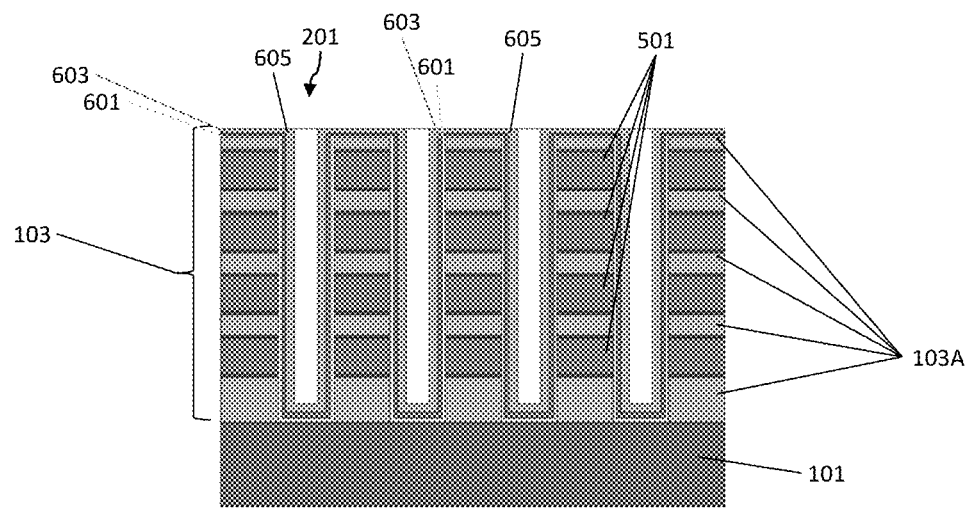

FIGS. 6A-6B illustrate a formation of TFT film stacks in the first trenches 201. Specifically, one or two ferroelectric strips 601, a semiconductor strip 603, and dielectric strips 605 are formed in each of the first trenches 201. In this embodiment, no other layers are formed in the first trenches 201.

The ferroelectric strips 601 are data-storing layers that may be polarized in one of two different directions by applying an appropriate voltage differential across the ferroelectric strips 601. Depending on a polarization direction of a particular region of a ferroelectric strip 601, a threshold voltage of a corresponding TFT 1511 (not illustrated in FIGS. 6A-6C but illustrated and described further below with respect to FIGS. 15A-15D) varies and a digital value (e.g., 0 or 1) can be stored. For example, when a region of ferroelectric strip 601 has a first electrical polarization direction, the corresponding TFT 1511 may have a relatively low threshold voltage, and when the region of the ferroelectric strip 601 has a second electrical polarization direction, the corresponding TFT 1511 may have a relatively high threshold voltage. The difference between the two threshold voltages may be referred to as the threshold voltage shift. A larger threshold voltage shift makes it easier (e.g., less error prone) to read the digital value stored.

The ferroelectric strips 601 may be formed of an acceptable ferroelectric material or other charge trapping material for storing digital values, such as hafnium zirconium oxide (HfZrO); hafnium aluminum oxide (HfAlO), zirconium oxide (ZrO); hafnium oxide (HfO) doped with lanthanum (La), silicon (Si), aluminum (Al), or the like; undoped hafnium oxide (HfO); or the like. The material of the ferroelectric strips 601 may be formed by an acceptable deposition process such as ALD, CVD, physical vapor deposition (PVD), or the like. The ferroelectric strips 601 or other charge trapping material may also be referred to herein as data storage strips, data storage material, charge trapping material, charge trapping strips, memory material, and/or memory strips.

The semiconductor strips 603 provide channel regions for the TFTs 1511 (not illustrated in FIGS. 6A-6C but illustrated and described further below with respect to FIGS. 15A-15D). For example, when an appropriate voltage (e.g., higher than a respective threshold voltage (Vth) of a corresponding TFT 1511) is applied through a corresponding word line 501, a region of a semiconductor strip 603 that intersects the word line 501 may allow current to flow from the bit line 1501 to source lines 1503 (not illustrated in FIGS. 6A-6C but illustrated and described further below with respect to FIGS. 15A-15D).

In an embodiment the semiconductor strips 603 are formed of an acceptable semiconductor material for providing channel regions of TFTs, such as zinc oxide (ZnO), indium tungsten oxide (InWO), indium gallium zinc oxide (InGaZnO), indium zinc oxide (InZnO), indium tin oxide (ITO), indium gallium zinc tin oxide (IGZTO), polysilicon, amorphous silicon, or the like. The material of the semiconductor strips 603 may be formed by an acceptable deposition process such as ALD, CVD, PVD, or the like. The semiconductor strips 603 may also be referred to herein as strips of semiconductor material, channel material strips, channel layers, and/or channel material.

The dielectric strips 605 are formed of a dielectric material. Acceptable dielectric materials include oxides such as silicon oxide and aluminum oxide; nitrides such as silicon nitride; carbides such as silicon carbide; the like; or combinations thereof such as silicon oxynitride, silicon oxycarbide, silicon carbonitride, or the like. The material of the dielectric strips 605 may be formed by an acceptable deposition process such as ALD, CVD, flowable CVD (FCVD), or the like.

Figure 7A:
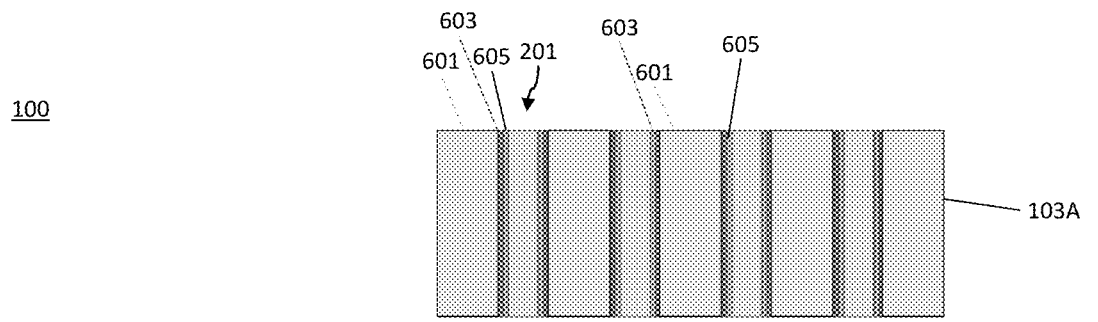
Figure 7B:
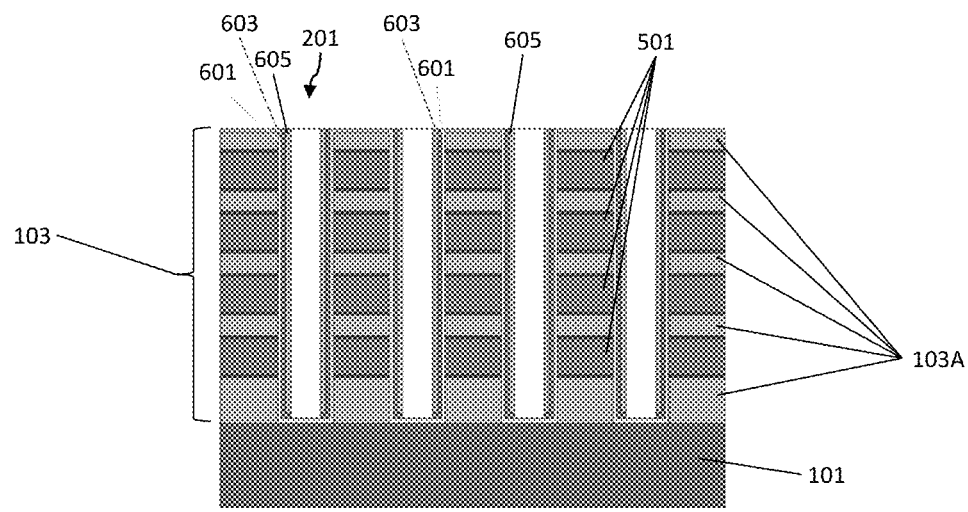

FIGS. 7A and 7B illustrate an anisotropic etch removal of the dielectric layer and the semiconductor layer along horizontal portions of the dielectric layer and the semiconductor layer, thus exposing the ferroelectric strips 601 along horizontal portions at the bottom of the first trenches 201, according to some embodiments. The portions of the ferroelectric layer, the semiconductor layer, and the dielectric layer remaining in the first trenches 201 form the ferroelectric strips 601, the semiconductor strips 603, and the dielectric strips 605, respectively.

Figure 8A:
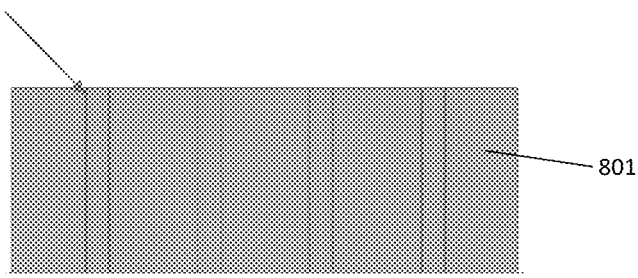
Figure 8B:
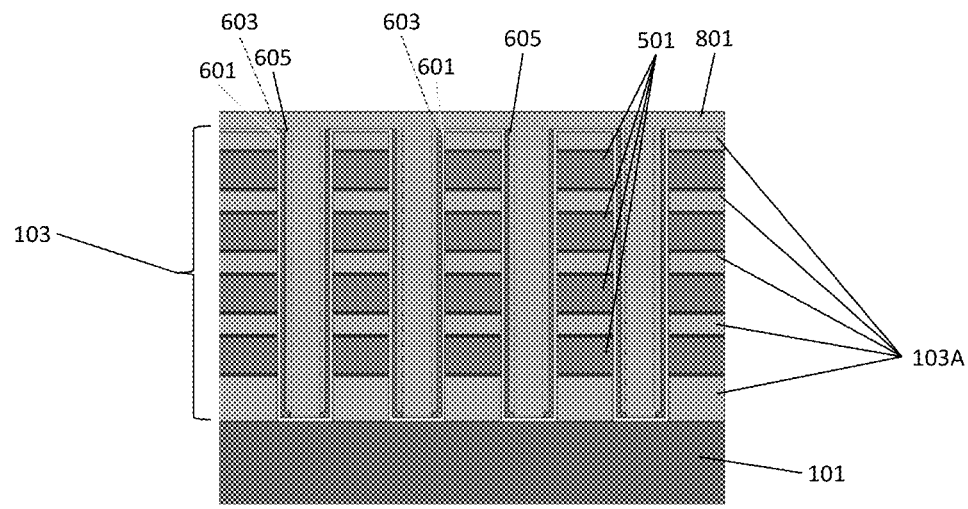

FIGS. 8A and 8B illustrate deposition of a first interlayer dielectric 801 to fill and/or overfill the first trenches 201, according to some embodiments. The first interlayer dielectric 801 may be formed using any of the materials suitable for forming the dielectric strips 605. An interface between the dielectric strips 605 and the first interlayer dielectric 801 is indicated by a dashed line. Although the interface is shown in the illustrated embodiments, an interface may or may not exist between the dielectric strips 605 and the first interlayer dielectric 801 depending on the materials of the dielectric strips 605 and the first interlayer dielectric 801. In some embodiments, the first interlayer dielectric 801 is formed using a silicon dioxide fill material in a process such as flowable CVD (FCVD). However, any suitable dielectric material and deposition process may be utilized. Once deposited, the first interlayer dielectric 801 may be planarized using a process such as chemical mechanical planarization.

Figure 9A:
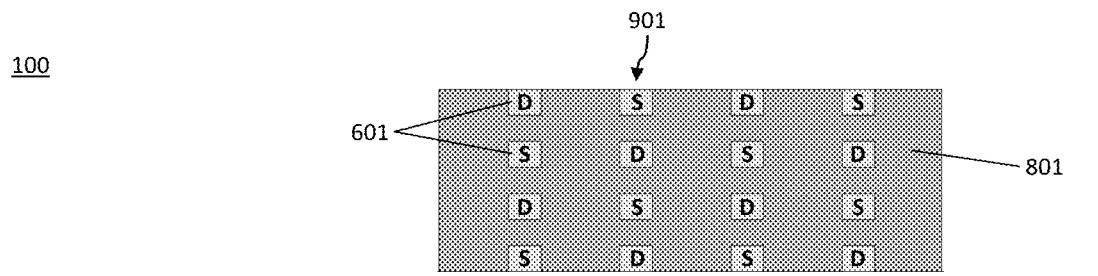
Figure 9B:
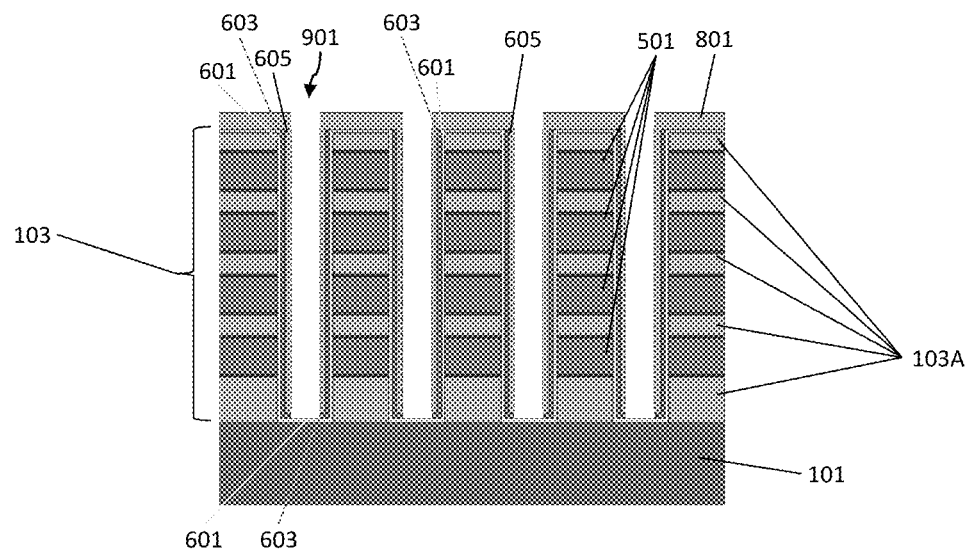

FIGS. 9A and 9B illustrate a formation of source/drain openings 901 through the first interlayer dielectric 801 and exposing the ferroelectric strips 601 and the semiconductor strips 603 at the bottoms of the source/drain openings 901. The source/drain openings 901 further extend through the first dielectric layers 103A and any remaining portions of the second dielectric layers 103B. The source/drain openings 901 can be formed using acceptable photolithography and etching techniques. The source/drain openings 901 are disposed in locations of source/drain regions for the TFTs being formed. For example, the source/drain openings 901 may be formed in pairs, with each of the semiconductor strips 603 being exposed within a corresponding drain region (e.g., labeled "D") and a corresponding source region (e.g., labeled "S").

Figures 10A, 10B, 10C:
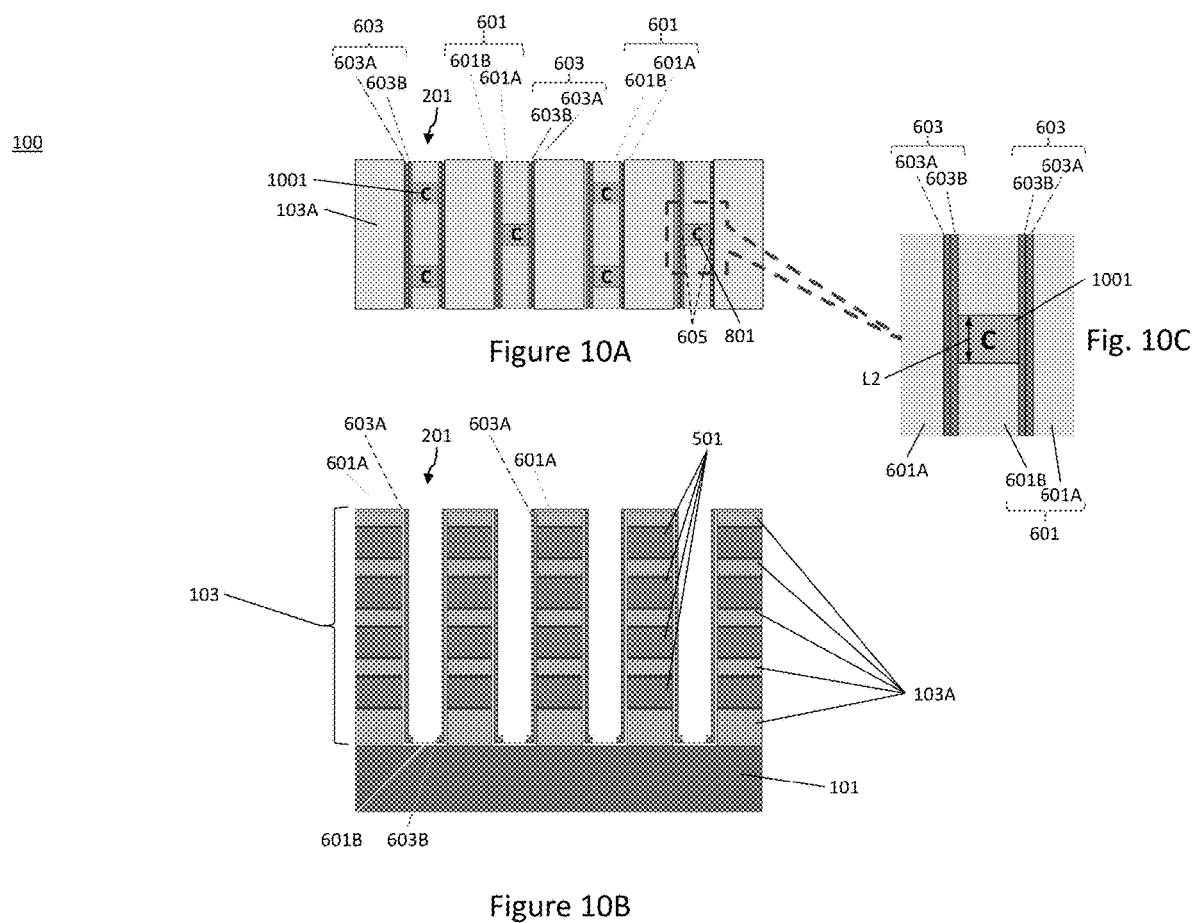

FIGS. 10A-10C illustrate a pullback process and formation of channel isolation structures 1001, according to some embodiments. The pullback process may be performed using acceptable photolithography and etching techniques to remove materials of the first interlayer dielectric 801. As such, remaining portions of the first interlayer dielectric 801 form the channel isolation structures 1001, in accordance with some embodiments. The channel isolation structures 1001 are formed in locations of channel regions for the TFTs being formed. As such, the channel isolation structures 1001 (e.g., labeled "C" in FIG. 10A) may be formed between the semiconductor strips 603 disposed along sidewalls of the first trenches 201 and in locations between corresponding drain regions and corresponding source regions (shown in FIG. 9A). In some embodiments, the channel isolation structures 1001 have a second length L2 of between about 20 nm and about 1000 nm. However, any suitable length may be used. The second length L2 may be referred to herein as the gate length of the device being formed. The gate length may depend on the desired purpose and/or function of the device being formed.

FIGS. 10A-10C further illustrate that the pullback process, according to some embodiments, re-exposes top portions of the semiconductor strips 603 (e.g., labeled 603A) and top portions of the ferroelectric strips 601 (e.g., labeled 601A) in a coplanar surface with the topmost layers of the first dielectric layers 103A. In addition, according to some embodiments, bottom portions of the semiconductor strips 603 (e.g., labeled 603B) and bottom portions of the ferroelectric strips 601 (e.g., labeled 601B) may be exposed at the bottoms of the first trenches 201 in between the channel isolation structures 1001.

Figures 11A, 11B, 11C:
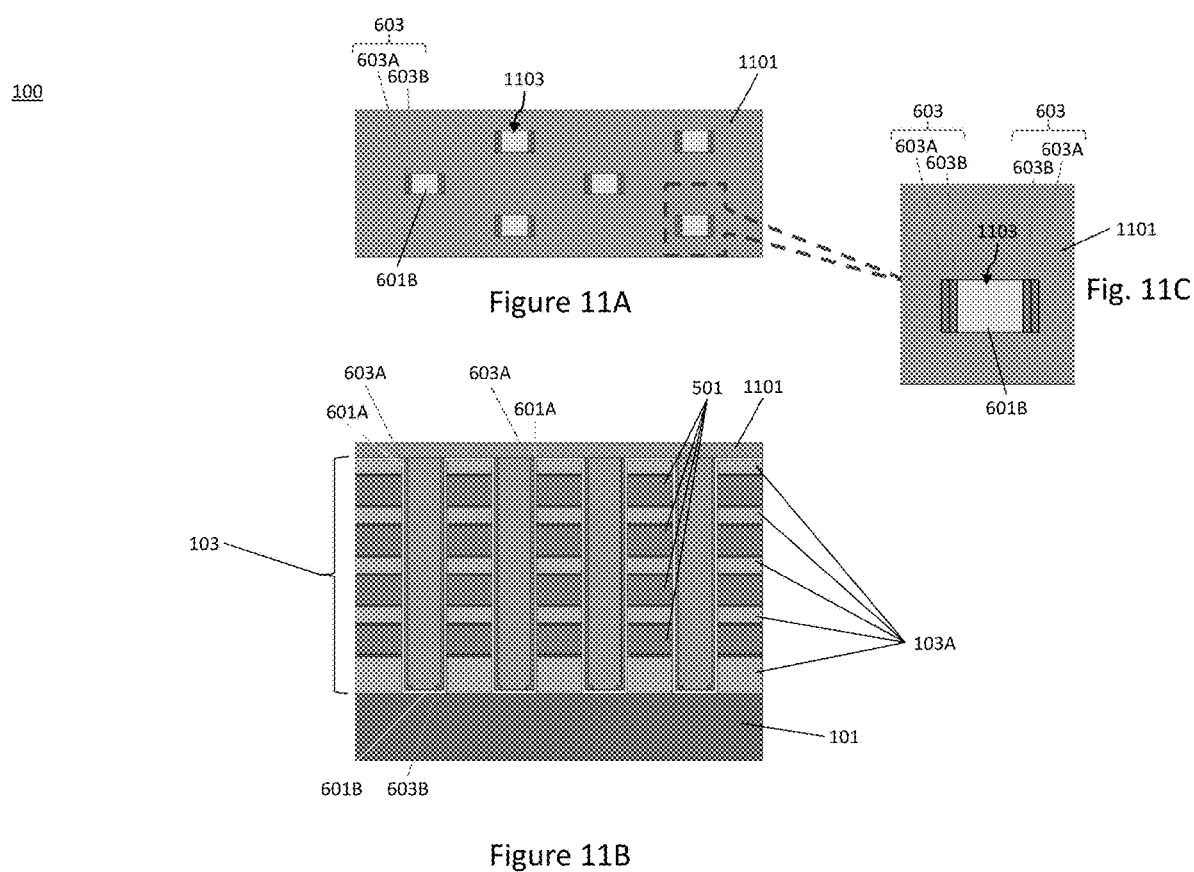

FIGS. 11A-11C illustrate a formation of a second interlayer dielectric 1101 and cut channel openings 1103 through the second interlayer dielectric 1101, according to some embodiments. The second interlayer dielectric 1101 may be formed using any of the materials suitable for forming the first interlayer dielectric 801 that is used to form the channel isolation structures 1001. However, the material chosen for the second interlayer dielectric 1101 may have an etch selectivity different from the material chosen for the first interlayer dielectric 801. For example, in embodiments using an oxide material such as silicon dioxide for the first interlayer dielectric 801 and thus the channel isolation structures 1001, the second interlayer dielectric 1101 may be formed using a nitride material such as a silicon nitride fill material in a process such as flowable CVD (FCVD). The second interlayer dielectric 1101 may be formed over the channel isolation structures 1001 and to fill and/or overfill the first trenches 201. However, any suitable dielectric material and deposition process may be utilized.

Once deposited, the second interlayer dielectric 1101 may be planarized using a process such as chemical mechanical planarization and the cut channel openings 1103 may be formed therein. Acceptable photolithography and etching techniques may be used to remove materials of the second interlayer dielectric 1101 to form a pattern of cut channel openings 1103 through the second interlayer dielectric 1101. According to some embodiments, the bottoms of the ferroelectric strips 601B, the bottoms of the semiconductor strips 603B, and the tops of the semiconductor strips 603A are exposed through the pattern of cut channel openings 1103. The cut channel openings 1103 are disposed in locations between the TFTs being formed.

Figure 12A:
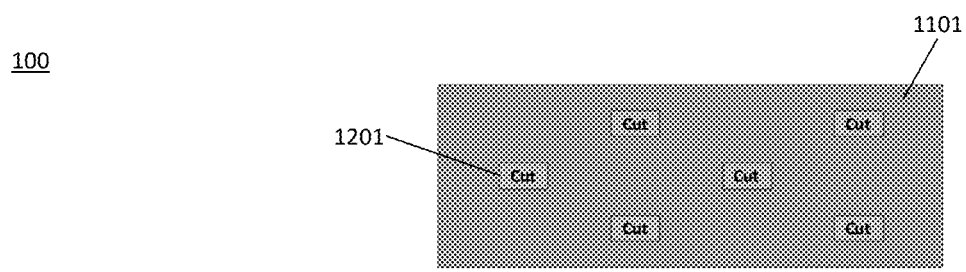
Figure 12B:
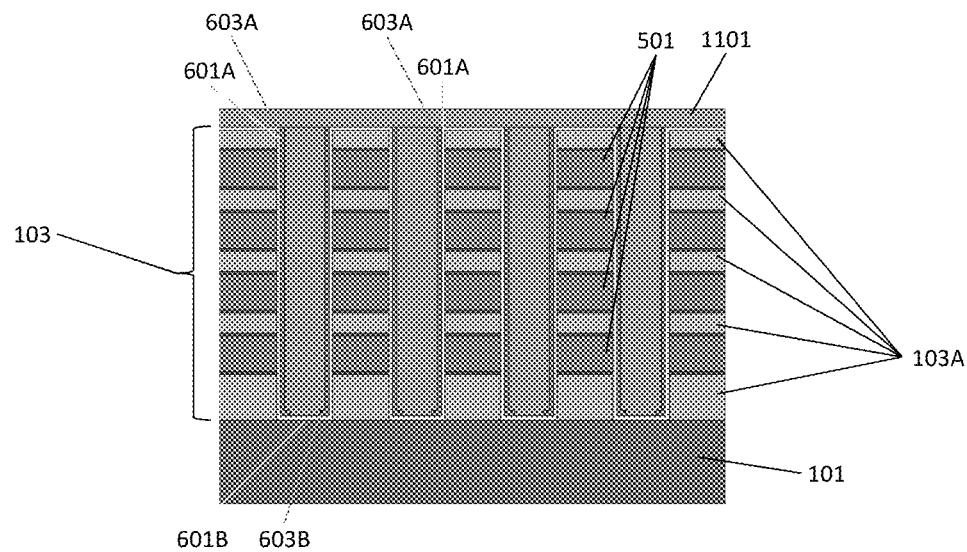

FIGS. 12A-12B illustrate a formation of cut channel plugs 1201, according to some embodiments. In some embodiments, a dielectric fill material may be formed to fill and/or overfill the cut channel openings 1103. Any of the dielectric materials suitable for forming the channel isolation structures 1001 may be used for the dielectric fill material. However, the material chosen for the dielectric fill material may have an etch selectivity different from the material used for the second interlayer dielectric 1101. For example, in embodiments using silicon nitride for the second interlayer dielectric 1101, the dielectric fill material may be formed using a silicon oxide in a process such as flowable CVD (FCVD). Once formed, the dielectric fill material is planarized with the second interlayer dielectric 1101 using acceptable planarization process such as a chemical mechanical polish (CMP), an etch-back process, combinations thereof, or the like. As such, tops of the cut channel plugs 1201 (e.g., labeled "Cut" in FIG. 12A) are exposed at a planar surface of the second interlayer dielectric 1101. The cut channel plugs 1201 may also be referred to herein as cut channel structures. In some embodiments, the cut channel plugs 1201 have a third length L3 (not illustrated in FIGS. 12A-12B but illustrated in FIG. 13C) of between about 20 nm and about 1000 nm. According to some embodiments, the third length L3 may be about the same as the second length L2. However, any suitable length may be used. The third length L3 may be referred to herein as an isolation space between two adjacent devices. The isolation space depends on the purpose and/or function of the desired design of the device being formed.

Figures 13A, 13B, 13C:
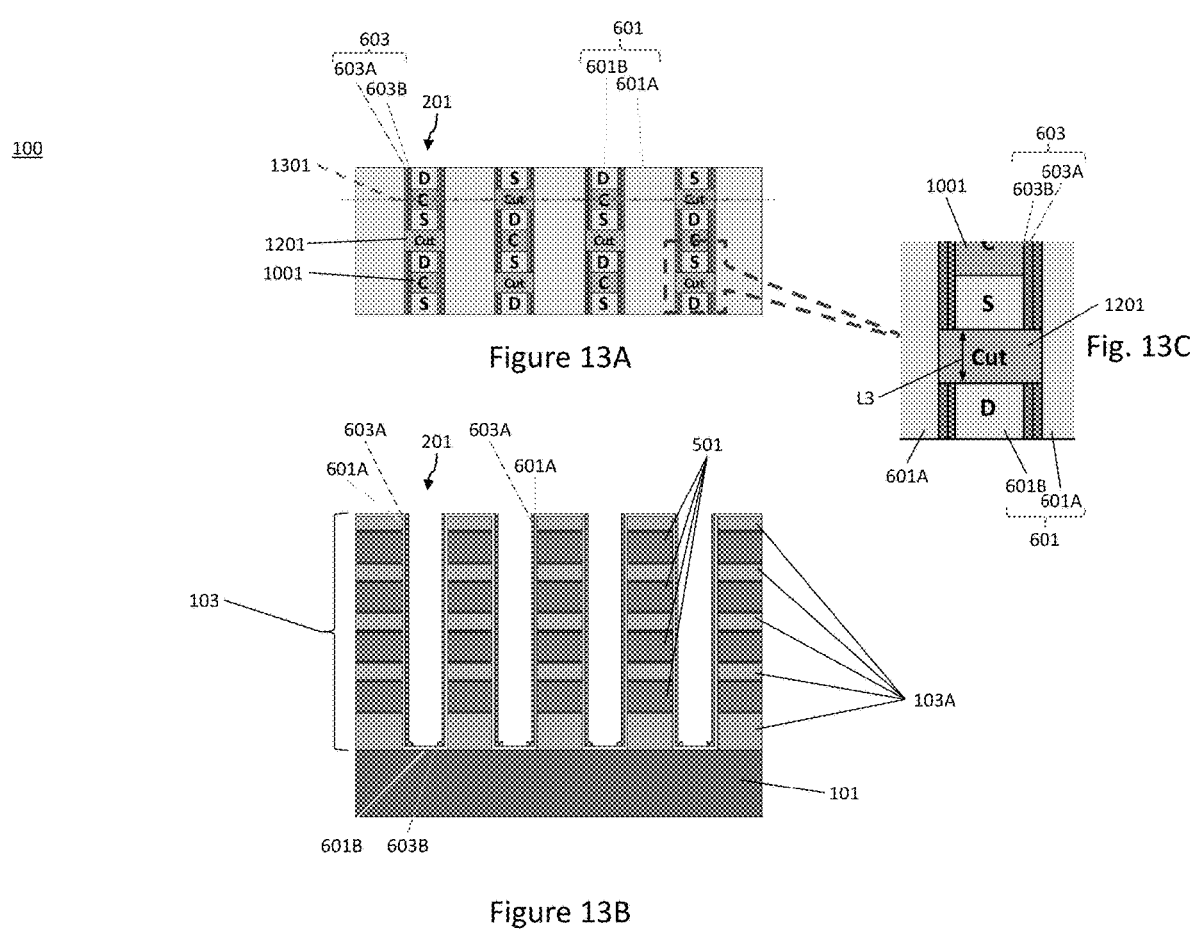

FIGS. 13A and 13B illustrate a removal of the second interlayer dielectric 1101, according to some embodiments. In some embodiments, the removal uses a precursor that is selective to the materials of the second interlayer dielectric 1101 and relatively non-selective to the materials of the channel isolation structures 1001 and the cut channel plugs 1201. For example, in embodiments in which the second interlayer dielectric 1101 is formed using silicon nitride and the channel isolation structures 1001 and the cut channel plugs 1201 are formed using silicon oxide, the second interlayer dielectric 1101 can be removed by a wet etch using phosphoric acid ($H_3PO_4$). However, any suitable etching process, such as a dry selective etch, may also be utilized. As such, sidewalls of the channel isolation structures 1001 and sidewalls of the cut channel plugs 1201 are exposed within the first trenches 201 in accordance with some embodiments.

FIGS. 13A and 13B further illustrate that the removal, according to some embodiments, re-exposes top portions of the semiconductor strips 603 (e.g., labeled 603A) and top portions of the ferroelectric strips 601 (e.g., labeled 601A). In addition, bottom portions of the semiconductor strips 603 (e.g., labeled 603B) and bottom portions of the ferroelectric strips 601 (e.g., labeled 601B) are re-exposed at the bottoms of the first trenches 201 in locations of the corresponding drain regions (e.g., labeled "D") and the corresponding source regions (e.g., labeled "S").

FIG. 13A further illustrates that the channel isolation structures 1001 may be aligned with or overlap with cut channel plugs 1201 of neighboring TFTs in the first memory array 100. For example, in some embodiments, the centerlines 1301 of the channel isolation structures 1001 may be aligned with centerlines 1301 of cut channel plugs 1201 of neighboring TFTs in the first memory array 100, according to some embodiments. For example, in the illustrated embodiment of FIG. 13A, centerlines 1301 through major axis of the channel isolation structures 1001 are aligned with centerlines 1301 through major axis of the cut channel plugs 1201 in the top row of 1001 and cut channel plugs 1201. In other embodiments, the cut channel plugs 1201 overlap the channel isolation structures 1001 along a line parallel with a centerline of the cut channel plugs 1201, or a first portion of the cut channel plugs 1201 is aligned with a second portion of the channel isolation structures 1001 in a direction parallel with a sidewall of the cut channel plugs 1201.

Furthermore, in some embodiments, the third length L3 of the cut channel plugs 1201 may be about the same as the second length L2 of the channel isolation structures 1001. In such embodiments, a ratio of the third length L3 to the second length L2 may be between about 1:1. However, any suitable ratio may be used. In some embodiments, the third length L3 being about the same as the second length L2 to allow for adjacent bit lines to be formed with a uniform space width (e.g., see FIG. 20A). In such embodiments, a bit line may be formed over source regions and drain regions of neighboring TFTs in the first memory array boo being formed (e.g., see FIG. 20A).

Figure 14A:
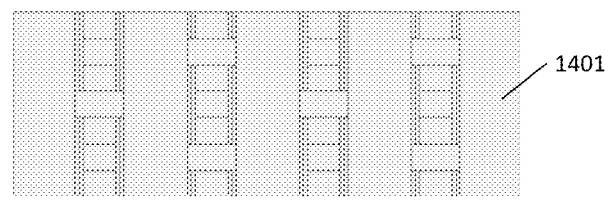
Figure 14B:
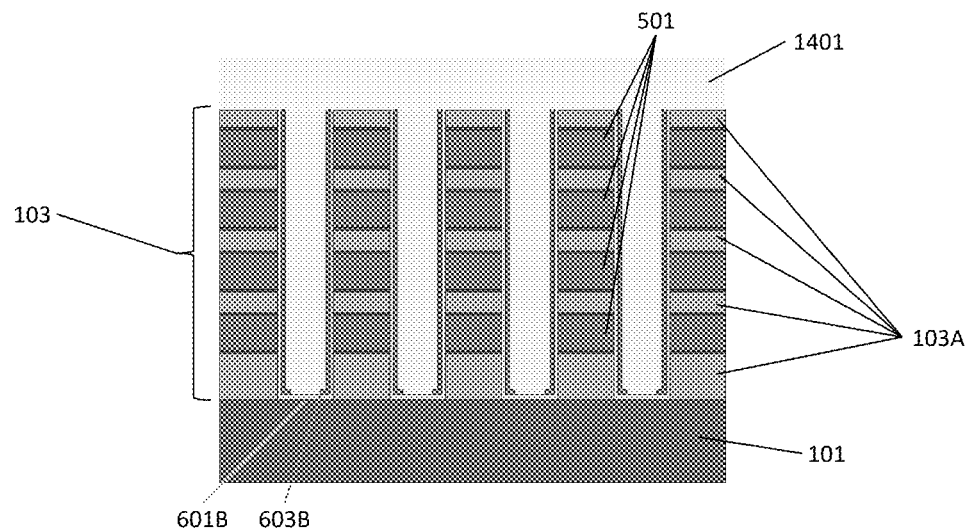
Figure 15D:
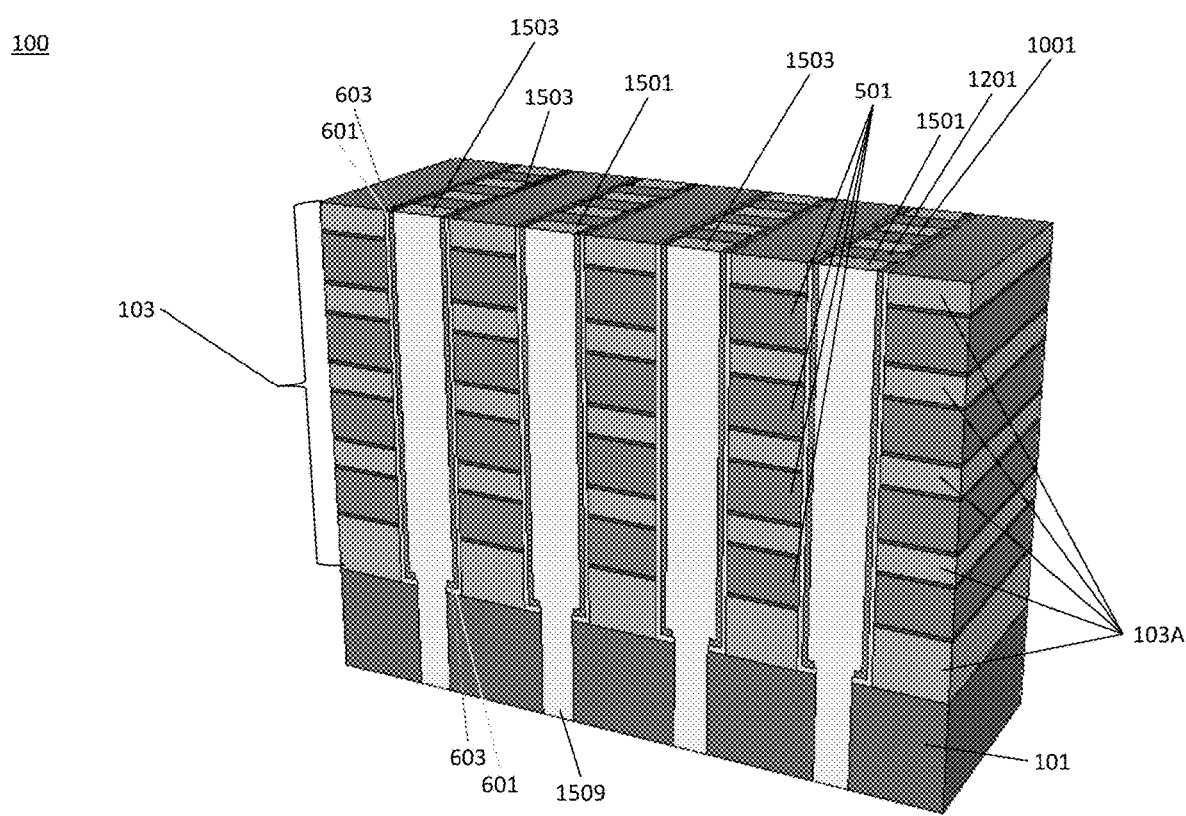

FIGS. 14A and 14B illustrate a metal deposition, according to some embodiments. The metal deposition may be a conformal deposition, although any suitable deposition process may be utilized. In some embodiments, the metal deposition comprises forming one or more conductive material(s) 1401, e.g., a glue layer and a bulk conductive material in the first trenches 201, in accordance with some embodiments. Acceptable conductive materials include metals such as tungsten, cobalt, aluminum, nickel, copper, silver, gold, alloys thereof, titanium nitride, tantalum nitride, combinations of these, or the like. The conductive material(s) 1401 may be formed by an acceptable deposition process such as ALD or CVD, an acceptable plating process such as electroplating or electroless plating, or the like.

FIGS. 15A-15D illustrate a formation of the first memory array 100, according to some embodiments. In particular, FIGS. 15A-15D illustrate a planarization process applied to the various layers of the conductive material(s) 1401 to remove excess material over the topmost of the first dielectric layers 103A. The planarization process may be a chemical mechanical polish (CMP), an etch-back process, combinations thereof, or the like. The remaining conductive material(s) form bit lines 1501 and source lines 1503 in the first trenches 201.

According to some embodiments, one or more of the bit lines 1501 and the source lines 1503 extend through the first dielectric layers 103A and act as source/drain regions of the TFTs 1511. The bit lines 1501 and the source lines 1503 are conductive columns that are formed in pairs, with each of the semiconductor strips 603 contacting a corresponding bit line 1501 and a corresponding source line 1503. Each TFT 1511 comprises a bit line 1501, a source line 1503, a word line 501, and the regions of the semiconductor strips 603 and the ferroelectric strip 601 intersecting the word line 501. Each of the cut channel plugs 1201 is disposed between a bit line 1501 of a TFT 1511 and a source line 1503 of an adjacent TFT 1511. In other words, a bit line 1501 of one of the TFTs 1511 and a source line 1503 of an adjacent TFT 1511 are disposed at opposing sides of each of the cut channel plugs 1201. Thus, each of the cut channel plugs 1201 physically separates and electrically isolates adjacent TFTs 1511.

FIG. 15B also illustrates a formation of conductive vias 1509 through the substrate 101, according to some embodiments. The conductive vias 1509 electrically couple the bit lines 1501 and/or the source lines 1503 for external connection through the substrate 101. According to some embodiments, the conductive vias 1509 may be formed after forming the bit lines 1501 and the source lines 1503. In such embodiments, the conductive vias 1509 may be formed by initially forming openings through a backside of the substrate 101. In such embodiments, an optional thinning of the substrate 101 may be performed to thin the substrate 101 to a desired thickness prior to forming the openings. The openings may be formed in desired locations of the conductive vias 1509 using acceptable photolithography and etching techniques to remove the materials of the substrate 101 and expose the ferroelectric strip 601 at the bottom of the openings. Once exposed, an anisotropic etching may be used to remove the ferroelectric strip 601 and expose the bit lines 1501 and/or the source lines 1503 at the bottom of the openings. The conductive vias 1509 may then be formed in the openings to electrically couple the bit lines 1501 and/or the source lines 1503 through the substrate 101, and then planarized using, e.g., a chemical mechanical polishing process.

In other embodiments, the conductive vias 1509 may be formed during formation of the bit lines 1501 and/or source lines 1503. In such embodiments, an anisotropic etch may be used to remove horizontal portions of the ferroelectric strips 601 at the bottoms of the first trenches 201, prior to forming the second interlayer dielectric 1101. For example, the horizontal portions of the ferroelectric strips 601 may be removed at the bottoms of the first trenches 201 during the anisotropic etch as discussed above with regard to FIGS. 7A and 7B. In another example, the horizontal portions of the ferroelectric strips 601 may be removed at the bottoms of the first trenches 201 in an anisotropic etch after removal of the second interlayer dielectric 1101 as discussed above with regard to FIGS. 13A and 13B. Once the ferroelectric strips 601 have been removed at the bottoms of the first trenches 201, the anisotropic etch may be continued to form openings into the substrate 101 in desired locations of the conductive vias 1509. In such embodiments, the openings in the substrate 101 are extensions to the first trenches 201 in the source/drain regions. As such, the conductive vias 1509 are formed as a bottom portion of the bit lines 1501 and/or the source lines 1503 during the metal deposition of the conductive material(s) 1401 as described above with regard to FIGS. 14A and 14B.

In still other embodiments, the conductive vias 1509 are formed in the substrate 101 prior to forming the multilayer stack 103 over the substrate 101. In such embodiments, openings may be formed into but not through the substrate 101 in desired locations of the conductive vias 1509. Once the openings have been formed into the substrate 101, a metal deposition may be performed to form the conductive vias 1509 in the openings of the substrate 101. The conductive vias 1509 may be formed using any of the conductive material(s) 1401 and/or processes suitable for forming the bit lines 1501 and/or the source lines 1503, as described above. Once formed, a planarization process may be used to remove any of the conductive material(s) 1401 outside of the openings. As such, the conductive vias 1509 are exposed in a planar surface of the substrate 101 and the multilayer stack 103 can be formed over the exposed conductive vias 1509 and the substrate 101. In such embodiments, the ferroelectric strips 601 are removed from the bottom of the first trenches 201 after removal of the second interlayer dielectric 1101 as described above with regard to FIGS. 13A and 13B. Once the ferroelectric strips 601 are removed, the conductive vias 1509 are exposed at the bottom of the first trenches 201. As such, the bit lines 1501 and/or the source lines 1503 are formed over and electrically coupled to the conductive vias 1509.

According to some embodiments, a backside thinning process may be performed to remove excess material of the substrate 101 and expose the conductive vias 1509 at a backside of the substrate 101. As such, the conductive vias 1509 may be exposed for further processing at a backside of the substrate 101 and for electrical connection to underlying circuitry.

Furthermore, FIGS. 15A and 15C illustrate a first memory cell 1507 (e.g., unit cell) of a TFT 1511, in accordance with some embodiments. In addition, dashed lines 1505 show that the channel isolation structures 1001 overlap or are aligned with the cut channel plugs 1201 of adjacent rows of the TFTs 1511, according to embodiments. For example, in the illustrated embodiment of FIG. 15A, a first dashed line 1505A shows that a first edge of the channel isolation structures 1001 are aligned with first edges of the cut channel plugs 1201 in neighboring memory cells. FIG. 15A further illustrates a second dashed line 1505B that shows a second edge of the channel isolation structures 1001 are aligned with second edges of the cut channel plugs 1201 in neighboring memory cells. As such, channel regions of the TFTs 1511 are interleaved with isolation regions between neighboring first memory cells 1507 of the first memory array 100.

Figure 16A:
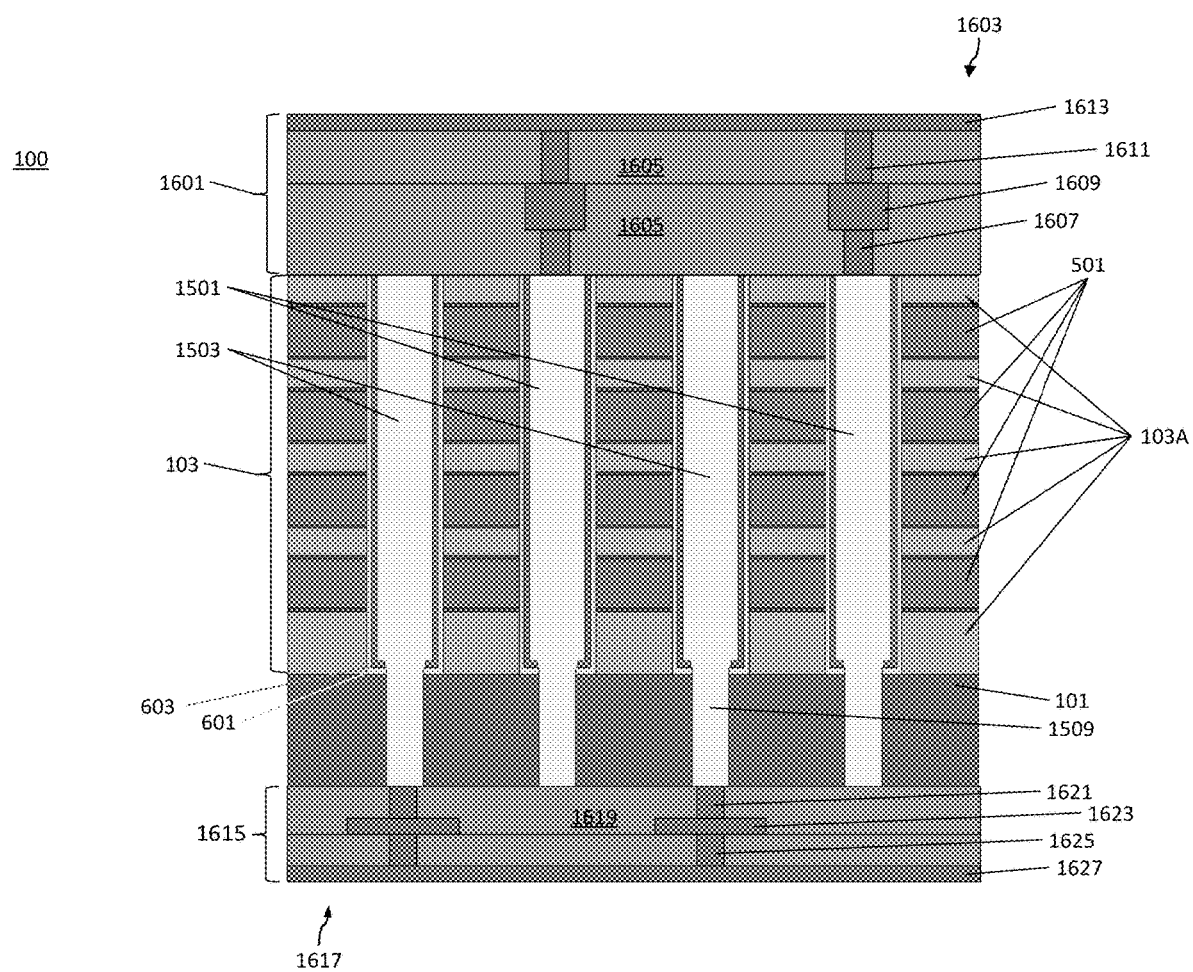
FIGS. 16A-16C illustrate various views of a formation of an bit line interconnect structure over and a formation a source line interconnect structure under the intermediate structure shown in FIGS. 15A-15D.
Figures 16B, 16C:
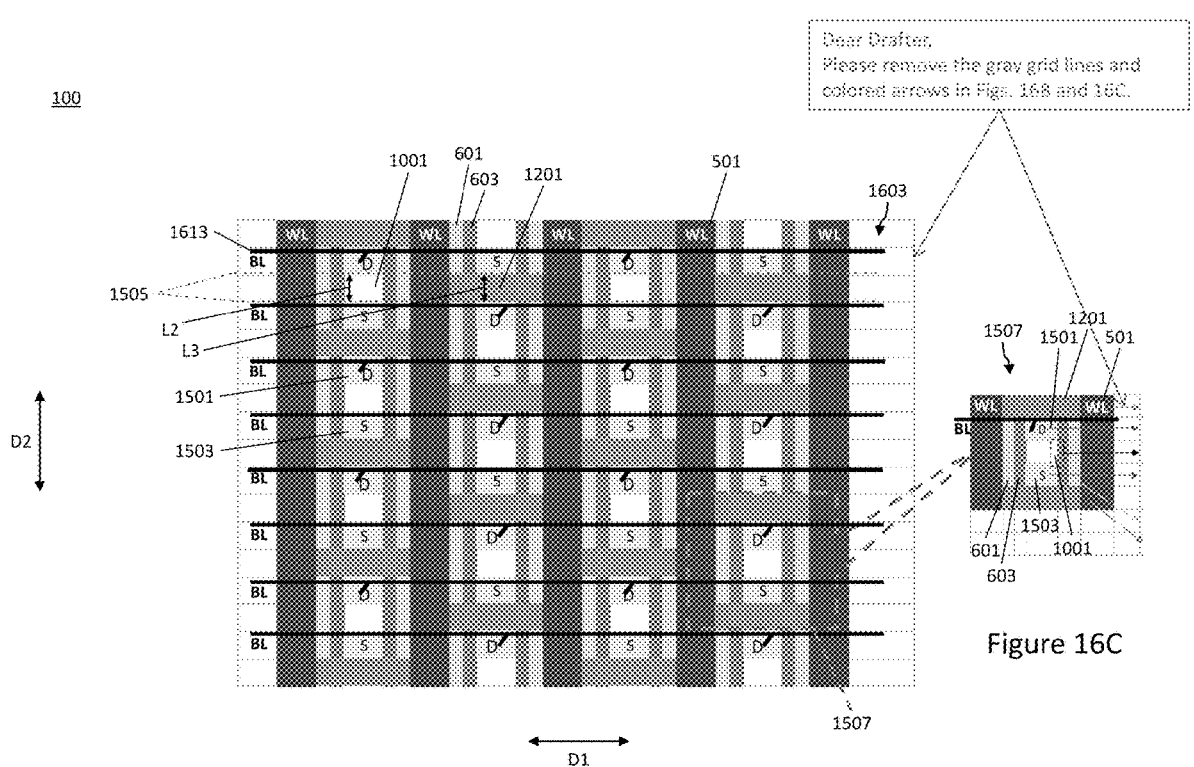

FIGS. 16A, 16B, and 16C illustrate, according to some embodiments, a formation of a first interconnect structure 1601 over the first memory array 100, a second interconnect structure 1615 under the first memory array 100, and a single memory cell of the first memory array 100, respectively. In particular, FIG. 16A illustrates a cross-sectional view of the first interconnect structure 1601 disposed over the first memory array 100 and the second interconnect structure 1615 disposed under the first memory array 100. FIG. 16B illustrates a top down view of the structure illustrated in FIG. 16A at the level of a first metallization pattern 1603 extending in the first direction D1 with the word lines 501 (labeled "WL") extending in the second direction D2, the bit lines 1501 (labeled "D"), and the source lines 1503 (labeled "S"), labeled for clarity of illustration, and FIG. 16C illustrating the unit cell of the first memory array 100 illustrated in FIG. 16B.

The first interconnect structure 1601 may include, e.g., first metallization patterns 1603 in a first dielectric material

1605. The first dielectric material 1605 may include one or more dielectric layers, such as one or more layers of a low-k (LK) or an extra low-K (ELK) dielectric material. The first metallization patterns 1603 may be metal interconnects (e.g., metal lines and vias) formed in the one or more dielectric layers. The first interconnect structure 1601 may be formed by a damascene process, such as a single damascene process, a dual damascene process, or the like.

In a particular embodiment that is illustrated, the first metallization patterns 1603 of the first interconnect structure 1601 comprise a first via 1607 (e.g., a via0) which makes contact to the bit lines 1501, a first metal line 1609 (e.g., a first top metal line), a second via 1611 (e.g., a via1), and bit line interconnects 1613 which are electrically coupled to the bit lines 1501. The bit line interconnect 1613 may also be referred to herein as a second metal line or a second top metal line. Each of these may be formed by depositing a portion of the first dielectric material 1605 (not separately illustrated in FIGS. 16B and 16C for clarity), forming patterns within the portion of the first dielectric material 1605, filling the patterns with one or more conductive materials, and planarizing the conductive materials with the first dielectric material 1605. However, any suitable number of vias and conductive lines may be utilized, and all such layers of connectivity are fully intended to be included within the scope of the embodiments.

FIG. 16A further illustrates formation of the second interconnect structure 1615, according to some embodiments. In a particular embodiment that is illustrated, second metallization patterns 1617 of the second interconnect structure 1615 comprise a third via 1621 (e.g., a via3) which makes contact to the source lines 1503, a third metal line 1623 (e.g., a first bottom metal line), a fourth via 1625 (e.g., a via4), and source line interconnects 1627 which are electrically coupled to the source lines 1503. Each of these may be formed by depositing a portion of the second dielectric material 1619 (not separately illustrated in FIGS. 16B and 16C for clarity), forming patterns within the portion of the second dielectric material 1619, filling the patterns with one or more conductive materials, and planarizing the conductive materials with the second dielectric material 1619. However, any suitable number of vias and conductive lines may be utilized, and all such layers of connectivity are fully intended to be included within the scope of the embodiments.

Referring now to FIG. 16B, the dashed lines 1505 illustrate that the cut channel plugs 1201 between adjacent first memory cells 1507 overlap or are aligned with the channel isolation structures 1001 of the neighboring first memory cells 1507, according to some embodiments. According to some embodiments, this alignment may be achieved by forming the channel isolation structures 1001 to have the second length L2 and forming the cut channel plugs 1201 to have the third length L3, wherein a ratio of the second length L2 to the third length L3 is within a desired ratio, as discussed above. In other words, locations of the channel isolation structures 1001 are interleaved with locations of the cut channel plugs 1201 of neighboring first memory cells 1507. As such, the adjacent bit lines 1501 are connected to different ones of the bit line interconnects 1613, which helps avoid shorting of the adjacent bit lines 1501 when their common word line 501 is activated. Similarly, the adjacent source lines 1503 are formed in connection with different ones of the source line interconnects 1627, which helps avoid shorting of the adjacent source lines 1503 when their common word line 501 is activated. This arrangement allows for straight conductive segments within the overlying first metallization patterns 1603 (e.g., the first metal line 1609). Similarly, this arrangement allows for straight conductive segments within the underlying second metallization patterns 1617 (e.g., the third metal line 1623). As can be seen, because the underlying connections have been formed in a staggered formation, the bit line interconnects 1613 and the source line interconnects 1627 can be placed in a straight line formation without the need for lateral interconnects. Such alignment greatly increases the line density of the bit line interconnects 1613 and the source line interconnects 1627 in the metallization layers.

FIG. 17 is a circuit diagram of the first memory array 100. In an embodiment each of the first memory cells 1507 is a flash memory cell that includes one of the thin film transistors (TFT) 1511. The gate of each TFT 1511 is electrically connected to a respective word line 501, a first source/drain region of each TFT 1511 is electrically connected to a respective bit line 1501, and a second source/drain region of each TFT 1511 is electrically connected to a respective source line 1503 (which are electrically connected to ground). The first memory cells 1507 in a same row of the first memory array 100 share a common word line 501 while the first memory cells 1507 in a same column of the first memory array 100 share a common bit line 1501 and a common source line 1503.

To perform a write operation on a particular first memory cell 1507, a write voltage is applied across a region of the ferroelectric strip 601 corresponding to the first memory cell 1507. The write voltage can be applied, for example, by applying appropriate voltages to the word line 501, the bit line 1501, and the source lines 1503 corresponding to the first memory cell 1507. By applying the write voltage across the region of the ferroelectric strip 601, a polarization direction of the region of the ferroelectric strip 601 can be changed. As a result, the corresponding threshold voltage of the corresponding TFT 1511 can be switched from a low threshold voltage to a high threshold voltage (or vice versa), so that a digital value can be stored in the first memory cell 1507. Because the word lines 501 and the bit lines 1501 intersect in the first memory array 100, individual first memory cells 1507 may be selected and written to.

To perform a read operation on a particular first memory cell 1507, a read voltage (a voltage between the low and high threshold voltages) is applied to the word line 501 corresponding to the first memory cell 1507. Depending on the polarization direction of the corresponding region of the ferroelectric strip 601, the TFT 1511 of the first memory cell 1507 may or may not be turned on. As a result, the bit line 1501 may or may not be discharged (e.g., to ground) through the source lines 1503, so that the digital value stored in the first memory cell 1507 can be determined. Because the word lines 501 and the bit lines 1501 intersect in the first memory array 100, individual first memory cells 1507 may be selected and read from.

FIG. 18 is a block diagram of a random-access memory 1800, in accordance with some embodiments. The random-access memory 1800 includes the first memory array 100, a row decoder 1801, and a column decoder 1803. The first memory array 100, the row decoder 1801, and the column decoder 1803 may each be part of a same semiconductor die, or may be parts of different semiconductor dies. For example, the first memory array 100 can be part of a first semiconductor die, while the row decoder 1801 and the column decoder 1803 can be parts of a second semiconductor die.

The first memory array 100 includes the first memory cells 1507, the word lines 501, and the bit lines 1501. The first memory cells 1507 are arranged in rows and columns. The word lines 501 and the bit lines 1501 are electrically connected to the first memory cells 1507. The word lines 501 are conductive lines that extend along the rows of the first memory cells 1507. The bit lines 1501 are conductive lines that extend along the columns of the first memory cells 1507.

The row decoder 1801 may be, e.g., a static CMOS decoder, a pseudo-NMOS decoder, or the like. During operation, the row decoder 1801 selects desired first memory cells 1507 in a row of the first memory array 100 by activating the word line 501 for the row. The column decoder 1803 may be, e.g., a static CMOS decoder, a pseudo-NMOS decoder, or the like, and may include writer drivers, sense amplifiers, combinations thereof, or the like. During operation, the column decoder 1803 selects bit lines 1501 for the desired first memory cells 1507 from columns of the first memory array 100 in the selected row, and reads data from or writes data to the selected first memory cells 1507 with the bit lines 1501.

FIGS. 19A-19C illustrate a second memory array 1900 comprising second memory cells 1903, according to some other embodiments. In particular, FIG. 19A illustrates a top-down view of the second memory array 1900. FIG. 19B illustrates a perspective view of the second memory array 1900, according to some embodiments. FIG. 19C illustrates a magnified view of a unit cell (e.g., the second memory cell 1903) of the second memory array 1900, according to some embodiments.

The second memory array 1900 of FIGS. 19A and 19C is similar to the first memory array 100 illustrated in FIGS. 15A-15D, except the second memory array 1900 comprises the second memory cells 1903 instead of the first memory cells 1507. The second memory cells 1903 are similar to the first memory cells 1507 except the second memory cells 1903 comprise optional channel spacers 1901. The optional channel spacers 1901 are formed along sidewalls of the semiconductor strip 603 within the first trenches 201 and extend along the length of the channel and into the source/drain regions of the TFTs 1511. As such, the high-k interlayer or dielectric (oxide) between the channel layer and the source line and bit line reduces the parasitic capacitance by decreasing the area between the source line and the bit line. According to some embodiments, the optional channel spacers 1901 are formed to a fourth length L4 of between about 30 nm and about 1500 nm. However, any suitable length may be used. According to some embodiments, the fourth length L4 may be equal to the second length L2 plus half of the sixth length L6.

According to some embodiments, the optional channel spacers 1901 is formed after the pullback process used to form the channel isolation structures 1001 (illustrated in FIGS. 10A-10C) and prior to depositing the conductive material(s) 1401 (illustrated in FIGS. 14A-14B). The optional channel spacers 1901 are formed using a dielectric film(s) such as a high-k dielectric material, an oxide material, combinations, or the like. A high-k dielectric material can have a k value greater than about 7.0, and may include a metal oxide or silicate of Hf, Al, Zr, La, Mg, Ba, Ti, Pb, multilayers thereof, or a combination thereof. The dielectric film may be conformally deposited over the illustrated structure, such as by plasma-enhanced CVD (PECVD), ALD, molecular-beam deposition (MBD), or another deposition technique. In an embodiment, the optional channel spacers 1901 are formed using a high-k dielectric material such as HfO in an atomic layer deposition (ALD) process. However, any acceptable materials and processes may be used. As such, the dielectric film is formed over the exposed surfaces of the channel isolation structures 1001, the semiconductor strip 603, and/or the ferroelectric strip 601 of the structure illustrated in FIGS. 10A-10C.

According to some embodiments, the optional channel spacers 1901 may be formed by initially depositing a dielectric film in the first trenches 201 and over the exposed surfaces of the channel isolation structures 1001, the semiconductor strip 603, and the ferroelectric strip 601. Once deposited, the dielectric film is patterned using acceptable photolithography and etching techniques to remove materials of the dielectric film. As such, remaining portions of the dielectric film form the optional channel spacers 1901, in accordance with some embodiments.

In other embodiments, the optional channel spacers 1901 may be formed by initially forming openings in the second interlayer dielectric 1101 at desired locations of the optional channel spacers 1901. Once the second interlayer dielectric 1101 has been patterned with the openings in the desired locations, the dielectric film may be deposited into the openings and over the second interlayer dielectric 1101. In such embodiments, a pull-back process and/or planarization process, similar to that described above with regard to FIGS. 13A-13C, may be used to remove horizontal portions of the dielectric film along with horizontal portions of the semiconductor strips 603. The pull-back process and/or planarization process re-exposes top portions of the semiconductor strips 603 (e.g., labeled 603A) and top portions of the ferroelectric strips 601 (e.g., labeled 601A). In addition, bottom portions of the ferroelectric strips 601 (e.g., labeled 601B) are re-exposed at the bottoms of the first trenches 201 in locations of the corresponding drain regions (e.g., labeled "D") and the corresponding source regions (e.g., labeled "S"). In such embodiments, the remaining portions of the dielectric film forms the optional channel spacers 1901 along sidewalls of the first trenches 201 and adjacent the semiconductor strips 603. In such embodiments, the optional channel spacers 1901 may be formed prior to forming the openings for the cut channel plugs 1201 as illustrated in FIGS. 11A-11C or after forming the cut channel plugs 1201 as illustrated in FIGS. 12A-12B.

Figures 20A, 20B:
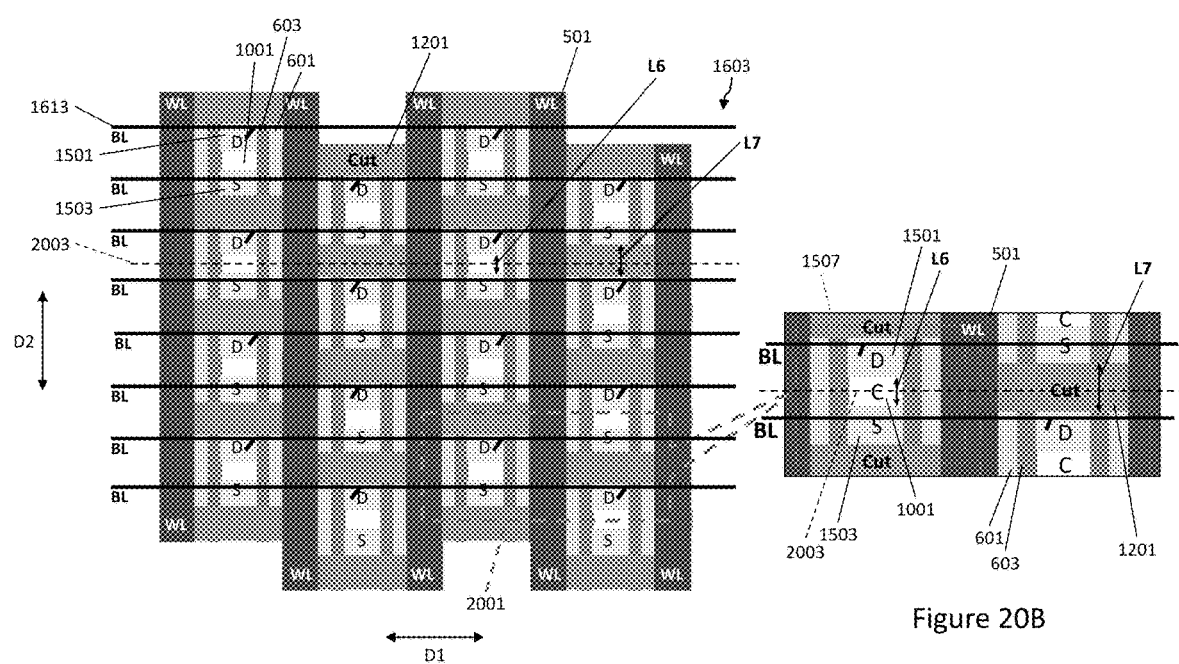
FIG. 20A-20B illustrate top down views of a memory array, according to further embodiments.

FIGS. 20A and 20B illustrate a third memory array 2000, according to some embodiments. The third memory array 2000 is similar to the first memory array 100 illustrated in FIGS. 16A-16C except the channel isolation structures 1001 and the cut channel plugs 1201 are formed to different lengths. In particular, FIG. 20A is a top-down view of the third memory array 2000 and is similar to the top-down view of FIG. 16B. FIG. 20B is a magnified view of a region 2001 of the third memory array 2000 highlighted by a dashed line in FIG. 20A. In such embodiments, centerlines of the channel isolation structures 1001 are aligned with centerlines of the cut channel plugs 1201 as indicated by the dashed line 2003. For example, centerlines of the channel isolation structures 1001 are aligned with centerlines of the cut channel plugs 1201 in corresponding rows of the third memory array 2000 in the first direction D1. Furthermore, a pitch and a position of the bit lines 1501 and source lines 1503 may also be aligned in corresponding rows of the third memory array 2000 in the first direction D1 in accordance with some embodiments. As such, the channel isolation structures 1001 are interleaved with the cut channel plugs 1201 in corresponding rows of the third memory array 2000 in the first direction D1.

According to some embodiments, the channel isolation structures 1001 are formed to a sixth length L6 between about 20 nm and about 1000 nm. Furthermore, the cut channel plugs 1201 may be formed to a seventh length L7 between about 20 nm and about 1000 nm. However, any suitable lengths may be used. According to some embodiments, a ratio of the seventh length L7 to the sixth length L6 may be between about 1:1. However, any suitable ratio may be used. In some embodiments, the seventh length L7 may be about the same as the sixth length L6 to allow for adjacent bit lines to be formed with a uniform space width (e.g., see FIG. 20A). In such embodiments, a bit line may be formed over source regions and drain regions of neighboring TFTs in the first memory array 100 being formed (e.g., see FIG. 20A).

By utilizing the above described processes, a 3D memory array may be formed with channel isolation structures being aligned with cut channel plugs of neighboring memory cells. As such, the 3D memory array is provided with a relaxed bit line 1501 and source line 1503 pitch with the channel isolation structures being aligned and interleaved with the cut channel plugs of neighboring memory cells across the 3D memory array. This alignment and interleaving prevents routing congestion for the bit line and source line interconnects and allows for random access of the memory cells at both sides of the word line. In particular, the channel isolation structures and the cut channel plugs of neighboring memory cells may be formed with centerlines being aligned and/or having equal lengths. As such, a large space is provided for the formation of high density memory cells and/or provides for R/C optimization of the metal lines and allows for random access of each cell. Additionally, this formation of high density array of memory cells can be achieved with a simple process flow.

According to an embodiment, a method of manufacturing a semiconductor device includes: etching a first trench and a second trench in a multilayer stack, the multilayer stack including alternating dielectric layers and sacrificial layers; forming word lines by replacing the sacrificial layers with a conductive material; forming a first transistor in the first trench, the first transistor including a first channel isolation structure; and forming a second transistor in the second trench adjacent a first cut channel plug, wherein the first cut channel plug overlaps the first channel isolation structure along a line parallel with a centerline of the first cut channel plug. In an embodiment of the method, a first length of the first channel isolation structure is equal to a second length of the first cut channel plug. In an embodiment, the method further includes: forming a first source line and a first bit line of the first transistor; and forming a second source line and a second bit line of the second transistor, a centerline of the second source line being aligned with a centerline of the first bit line. In an embodiment of the method, the forming the first transistor further includes: forming a ferroelectric strip along a sidewall of the first trench; forming a semiconductor strip adjacent the ferroelectric strip; and forming a channel spacer adjacent the semiconductor strip. In an embodiment of the method, a first length of the first cut channel plug is greater than a second length of the first channel isolation structure. In an embodiment, the method further includes: etching a third trench in the multilayer stack adjacent to the first trench; forming a second cut channel plug in the third trench, wherein the first cut channel plug overlaps the second channel isolation structure along the line. In an embodiment of the method, a centerline of the first cut channel plug is aligned with a centerline of the first channel isolation structure.

In another embodiment, a method of manufacturing a semiconductor device includes: forming an alternating stack of first dielectric materials and sacrificial materials; etching a first trench and a second trench in the alternating stack of first dielectric materials and sacrificial materials; forming a first word line between the first trench and the second trench; depositing a charge trapping material along sidewalls of the first trench and the second trench; depositing a channel material adjacent the charge trapping material; forming a first isolation structure in the first trench; removing portions of the channel material and the charge trapping material along sidewalls of the second trench; and forming a first cut channel structure in the second trench and adjacent the first word line, a centerline of the first cut channel structure being aligned with a centerline of the first isolation structure. In an embodiment of the method, a first length of the first isolation structure is equal to a second length of the first cut channel structure. In an embodiment, the method also includes: forming a second isolation structure in the second trench; forming a first source line and a first drain line in the first trench, the first source line and the first bit line being separated by the first isolation structure; and forming a second source line and a second bit line in the second trench, the second source line and the second bit line being separated by the second isolation structure, a centerline of the second bit line being aligned with a centerline of the first source line. In an embodiment, the method further includes forming a spacer material adjacent the channel material, the spacer material separating the first isolation structure from the channel material. In an embodiment of the method, a first length of the first cut channel structure is greater than a second length of the first isolation structure. In an embodiment, the method further includes: etching a third trench in the alternating stack of first dielectric materials and sacrificial materials adjacent to the first trench; and forming a second cut channel structure in the third trench, the first isolation structure being interleaved with the first cut channel structure and the second cut channel structure. In an embodiment, the method includes a sidewall of the first cut channel structure is aligned with a sidewall of the first isolation structure.

In still another embodiment, a semiconductor device includes: a first memory cell including: a first charge trapping strip extending away from a substrate; a first channel layer adjacent a first side of the first charge trapping strip; and a first channel isolation structure adjacent the first channel layer opposite the first charge trapping strip; a second memory cell including: a second charge trapping strip extending away from the substrate; and a second channel layer adjacent a first side of the second charge trapping strip; a first word line disposed between and electrically coupled to a second side of the first charge trapping strip and a second side of the second charge trapping strip; and a first cut channel structure adjacent the second memory cell, wherein a first portion of the first cut channel structure is aligned with a second portion of the first channel isolation structure in a direction parallel with a sidewall of the first cut channel structure. In an embodiment of the semiconductor device, a length of the first channel isolation structure is equal to a length of the first cut channel structure. In an embodiment of the semiconductor device, the first memory cell further includes a source line adjacent and electrically coupled to the first channel layer opposite the first charge trapping strip; and the second memory cell further includes a bit line adjacent and electrically coupled to the second channel layer opposite the second charge trapping strip, the source line of the first memory cell being aligned with the bit line of the second memory cell. In an embodiment of the semiconductor device, a length of the first cut channel structure is different than a length of the first channel isolation structure. In an embodiment of the semiconductor device, the first memory cell further includes a channel spacer disposed between the first channel layer and the first channel isolation structure. In an embodiment of the semiconductor device, a centerline of the first cut channel structure is aligned with a centerline of the first channel isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first memory cell comprising:
      a first charge trapping strip extending away from a substrate;
      a first channel layer adjacent a first side of the first charge trapping strip; and
      a first channel isolation structure adjacent the first channel layer opposite the first charge trapping strip;
   a second memory cell comprising:
      a second charge trapping strip extending away from the substrate; and
      a second channel layer adjacent a first side of the second charge trapping strip;
   a first word line disposed between and electrically coupled to a second side of the first charge trapping strip and a second side of the second charge trapping strip, wherein a width of the first channel isolation structure along a first line parallel to a longitudinal axis of the first word line in a plan view is less than a width of the first channel layer along a second line parallel to a longitudinal axis of the first word line in the plan view; and
   a first cut channel structure adjacent the second memory cell, wherein a first portion of the first cut channel structure is aligned with the first channel isolation structure in a direction parallel with a sidewall of the first cut channel structure.

2. The semiconductor device of claim 1, wherein a length of the first channel isolation structure is equal to a length of the first cut channel structure.

3. The semiconductor device of claim 2, wherein:
   the first memory cell further comprises a source line adjacent and electrically coupled to the first channel layer opposite the first charge trapping strip; and
   the second memory cell further comprises a bit line adjacent and electrically coupled to the second channel layer opposite the second charge trapping strip, the source line of the first memory cell being aligned with the bit line of the second memory cell.

4. The semiconductor device of claim 1, wherein a length of the first cut channel structure is different from a length of the first channel isolation structure.

5. The semiconductor device of claim 1, wherein the first memory cell further comprises a channel spacer disposed between the first channel layer and the first channel isolation structure.

6. The semiconductor device of claim 1, wherein a centerline of the first cut channel structure is aligned with a centerline of the first channel isolation structure.

7. A semiconductor device comprising:
   a first multilayer stack and a second multilayer stack over a substrate, each of the first multilayer stack and the second multilayer stack comprising alternating dielectric layers and conductive layers;
   a first channel layer along sidewalls of the first multilayer stack;
   a first conductive column extending through the first multilayer stack and the second multilayer stack;
   a second conductive column extending through the first multilayer stack and the second multilayer stack;
   a first insulating column extending through the first multilayer stack and the second multilayer stack, wherein the first insulating column is between the first conductive column and the second conductive column, wherein the first channel layer is between the first multilayer stack and the first conductive column, the second conductive column, and the first insulating column; and
   a first cut channel structure extending through the first multilayer stack and the second multilayer stack, wherein the first cut channel structure is adjacent to the first conductive column, wherein the first cut channel structure extends through the first channel layer towards the first multilayer stack.

8. The semiconductor device of claim 7, further comprising:
   a second channel layer along sidewalls of the first multilayer stack;
   a third conductive column extending through the first multilayer stack and the second multilayer stack;
   a fourth conductive column extending through the first multilayer stack and the second multilayer stack; and
   a second insulating column extending through the first multilayer stack and the second multilayer stack, wherein the second insulating column is between the third conductive column and the fourth conductive column, wherein the second channel layer is between the first multilayer stack and the third conductive column, the fourth conductive column, and the second insulating column.

9. The semiconductor device of claim 8, wherein the first cut channel structure separates the first channel layer from the second channel layer.

10. The semiconductor device of claim 7, further comprising:
    a first ferroelectric layer along sidewalls of the first multilayer stack, wherein the first ferroelectric layer is between the first channel layer and the first multilayer stack.

11. The semiconductor device of claim 10, wherein the first cut channel structure extends through the first channel layer to the first ferroelectric layer.

12. The semiconductor device of claim 7, wherein the first conductive column extends into the substrate.

13. The semiconductor device of claim 7, wherein the conductive layers comprise a first conductive line, wherein the first conductive line is a first word line of a memory cell.

14. The semiconductor device of claim 7, further comprising:
    a second channel layer along sidewalls of the second multilayer stack, wherein each of the first conductive column, the second conductive column, and the first insulating column contacts both the first channel layer and the second channel layer.

15. A semiconductor device comprising:
a first memory cell comprising:
   a first conductive strip over a substrate;
   a first charge trapping layer along a sidewall of the first conductive strip;
   a first channel layer along a first side of the first charge trapping opposite the first conductive strip;
   a first source column adjacent a first side of the first channel layer;
   a first drain column adjacent the first side of the first channel layer; and
   a first channel isolation structure adjacent the first side of the first channel layer, wherein the first channel isolation structure is between the first source column and the first drain column;
a second memory cell comprising:
   a second conductive strip over the substrate;
   a second charge trapping layer along a sidewall of the second conductive strip;
   a second channel layer along a first side of the second charge trapping layer opposite the second conductive strip; and
   the first source column, the first drain column, and the first channel isolation structure, wherein each of the first source column, the first drain column, and the first channel isolation structure contacts the first channel layer and the second channel layer; and
   a first cut channel structure adjacent to the first source column, wherein the first cut channel structure extends through the first channel layer to the first charge trapping layer.

16. The semiconductor device of claim 15, wherein the first charge trapping layer separates the first cut channel structure from the first conductive strip.

17. The semiconductor device of claim 16, further comprising:
a third memory cell comprising:
   a third conductive strip over the first conductive strip;
   the first charge trapping layer, wherein the first charge trapping layer extends along a sidewall of the third conductive strip;
   the first channel layer, wherein the first channel layer extends along the first side of the first charge trapping layer opposite the third conductive strip;
   the first source column;
   the first drain column; and
   the first channel isolation structure.

18. The semiconductor device of claim 15, wherein the first source column extends into the substrate.

19. The semiconductor device of claim 15, wherein the first source column extends completely through the substrate to a redistribution structure.

20. The semiconductor device of claim 7, further comprising:
a redistribution structure on a backside of the substrate, wherein the first conductive column extends through the substrate to the redistribution structure.

* * * * *